US007994493B2

(12) United States Patent
Cho et al.

(10) Patent No.: US 7,994,493 B2
(45) Date of Patent: Aug. 9, 2011

(54) PHASE CHANGE MEMORY DEVICES EMPLOYING CELL DIODES AND METHODS OF FABRICATING THE SAME

(75) Inventors: Woo-Yeong Cho, Hwaseong-si (KR);
Du-Eung Kim, Yongin-si (KR);
Yun-Seung Shin, Seoul (KR);
Hyun-Geun Byun, Yongin-si (KR);
Sang-Beom Kang, Hwaseong-si (KR);
Beak-Hyung Cho, Hwaseong-si (KR);
Choong-Keun Kwak, Suwon-si (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 12/196,137

(22) Filed: Aug. 21, 2008

(65) Prior Publication Data

US 2008/0303016 A1 Dec. 11, 2008

Related U.S. Application Data

(62) Division of application No. 11/324,112, filed on Dec. 30, 2005, now Pat. No. 7,427,531.

(30) Foreign Application Priority Data

Feb. 24, 2005  (KR) ........................ 10-2005-0015564

(51) Int. Cl.
*H01L 29/04* (2006.01)
*H01L 47/00* (2006.01)
(52) U.S. Cl. .. 257/5; 257/2; 257/3; 257/4; 257/E29.003; 257/E47.001
(58) Field of Classification Search .................. 257/2–5, 257/E29.002–E29.006, E47.001
See application file for complete search history.

(56) References Cited

U.S. PATENT DOCUMENTS

| 5,166,758 | A | 11/1992 | Ovshinsky et al. |
| 6,236,059 | B1 | 5/2001 | Wolstenholme et al. |
| 6,426,891 | B1 | 2/2002 | Katori |
| 6,534,781 | B2 | 3/2003 | Dennison |
| 6,605,527 | B2 | 8/2003 | Dennison |

(Continued)

FOREIGN PATENT DOCUMENTS

CN                1411000           4/2003
(Continued)

OTHER PUBLICATIONS

US20030186481 is English Abstract corresponding to CN1449021.
(Continued)

*Primary Examiner* — Anh Phung
*Assistant Examiner* — Allison P Bernstein
(74) *Attorney, Agent, or Firm* — Muir Patent Consulting, PLLC

(57) ABSTRACT

Phase change memory devices may include a semiconductor substrate of a first conductivity type and a plurality of parallel word lines disposed on the semiconductor substrate. The word lines may have a second conductivity type different from the first conductivity type and substantially flat top surfaces. First and second semiconductor patterns may be sequentially stacked on each word line, and an insulating layer may be provided to fill gap regions between the word lines, gap regions between the first semiconductor patterns and gap regions between the second semiconductor patterns. A plurality of phase change material patterns may be two-dimensionally arrayed on the insulating layer and electrically connected to the second semiconductor patterns.

81 Claims, 16 Drawing Sheets

U.S. PATENT DOCUMENTS

| | | | |
|---|---|---|---|
| 6,774,388 B2 * | 8/2004 | Hudgens et al. | 257/3 |
| 7,087,444 B2 | 8/2006 | Wong et al. | |
| 7,227,171 B2 | 6/2007 | Bez et al. | |
| 7,259,040 B2 | 8/2007 | Pellizer et al. | |
| 7,598,112 B2 * | 10/2009 | Park et al. | 438/95 |
| 2003/0058686 A1 | 3/2003 | Ooishi et al. | |
| 2003/0067013 A1 | 4/2003 | Ichihara et al. | |
| 2003/0111679 A1 | 6/2003 | Kuge | |
| 2003/0186481 A1 | 10/2003 | Lung | |
| 2004/0051094 A1 | 3/2004 | Ooishi et al. | |

FOREIGN PATENT DOCUMENTS

| | | |
|---|---|---|
| CN | 1449021 | 10/2003 |
| JP | 2004193282 | 8/2004 |

OTHER PUBLICATIONS

US20030058686 is English Abstract corresponding to CN1411000.

Notice of Allowance dated May 14, 2008 in corresponding parent application U.S. Appl. No. 11/324,112.

Office Action from European Patent Office re Application No. 06002902.2 dated Feb. 14, 2011.

* cited by examiner

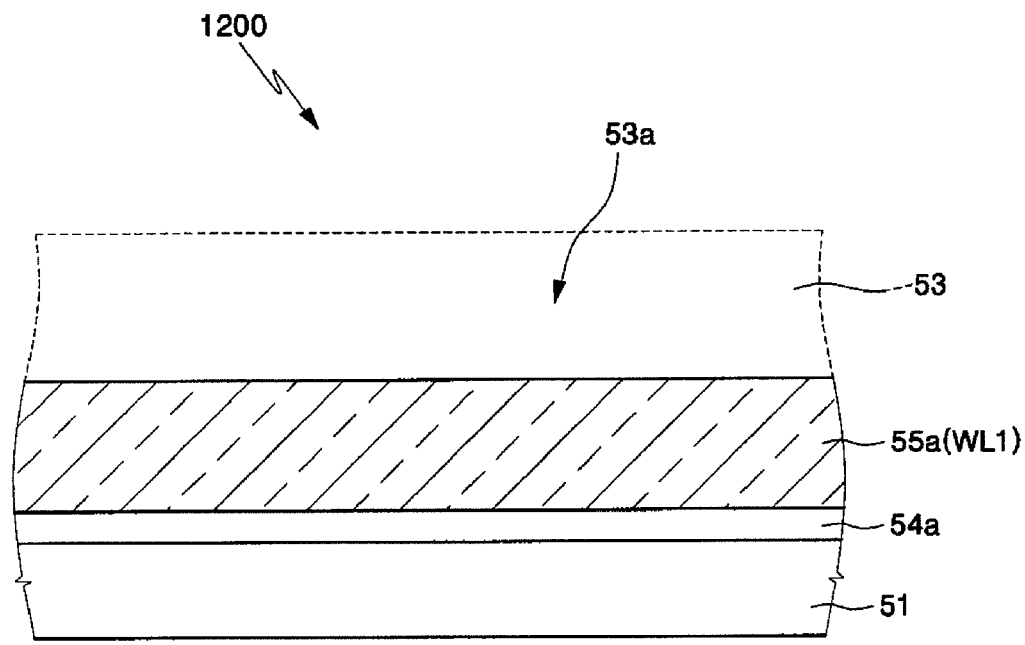
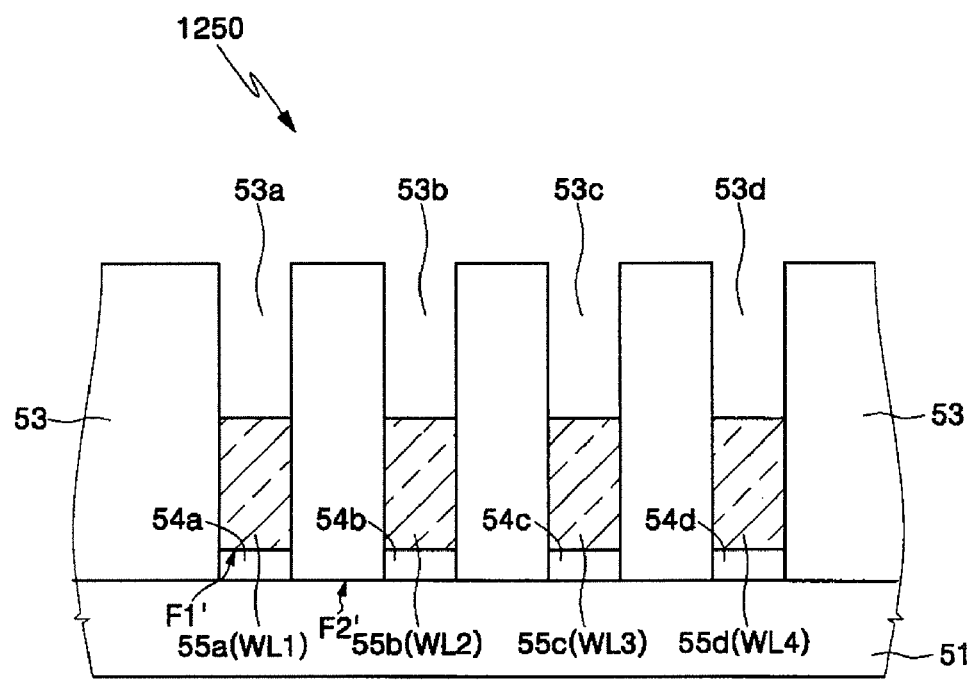

PHASE CHANGE MEMORY DEVICES EMPLOYING CELL DIODES AND METHODS OF FABRICATING THE SAME

CROSS-REFERENCE TO RELATED APPLICATIONS

This application is a Divisional of U.S. patent application Ser. No. 11/324,112, filed on Dec. 30, 2005 now U.S. Pat. No. 7,427,531, and entitled "PHASE CHANGE MEMORY DEVICES EMPLOYING CELL DIODES AND METHODS OF FABRICATING THE SAME", which, in turn, claims foreign priority under 35 U.S.C. §119 to Korean Patent Application No. 10-2005-0015564, filed on Feb. 24, 2005 in the Korean Intellectual Property Office, the disclosures of which are incorporated by reference herein in their entireties.

BACKGROUND OF THE INVENTION

1. Field of the Invention

The present disclosure relates to semiconductor memory devices and, more particularly, to memory devices employing cell diodes.

2. Description of Related Art

Non-volatile memory devices have an advantage in that data stored in such memory cells does not vanish when electrical power is not supplied to the memory cells. The non-volatile memory devices mainly employ flash memory cells having a stacked gate structure. The stacked gate structure includes a tunnel oxide layer, a floating gate, an inter-gate dielectric layer and a control gate electrode, which are sequentially stacked on a channel region. Therefore, in order to enhance reliability and program efficiency of the flash memory cells, film quality of the tunnel oxide layer should be improved and a coupling ratio of the flash memory cell should be increased.

Recently, novel non-volatile memory cells such as phase change memory cells have been proposed instead of the flash memory cells. Methods of fabricating the phase change memory cells are disclosed in U.S. Pat. No. 6,605,527 B2 to Dennison et al., entitled "Reduced Area Insertion Between Electrode and Programming Element". According to Dennison et al., the phase change memory cells are disposed at cross points between a plurality of bit lines and a plurality of word lines. In addition, each of the phase change memory cells includes a phase change material pattern and a cell diode, which are electrically connected in series. An N-type semiconductor of the cell diode is electrically connected to the word line, and the phase change material pattern is electrically connected to the bit line. The process for forming the word lines and the cell diodes includes a first process for sequentially forming a first N-type semiconductor layer, a second N-type semiconductor layer having a lower impurity concentration than the first N-type semiconductor layer and a P-type semiconductor layer on a P-type semiconductor substrate using an epitaxial technique and a second process for forming a metal silicide layer on the P-type semiconductor layer.

The metal silicide layer, the P-type semiconductor-layer, the second N-type semiconductor layer and the first N-type semiconductor layer are patterned to form a plurality of parallel N-type word lines disposed on the P-type semiconductor substrate as well as second N-type semiconductor patterns, P-type semiconductor patterns and metal silicide patterns which are sequentially stacked on the respective N-type word lines. In this case, the P-type semiconductor substrate may be over-etched while the first N-type semiconductor layer is etched to form the word lines. This is because the P-type semiconductor substrate may not have an etch selectivity with respect to the first N-type semiconductor layer. As a result, deep trench regions having a high aspect ratio may be formed between the word lines. Such deep trench regions may not be completely filled with an isolation layer to be formed in a subsequent process. That is, the high aspect ratio of the deep trench regions may cause voids or seams in the isolation layer.

In addition, the second N-type semiconductor patterns, the P-type semiconductor patterns and the metal silicide patterns on the word lines are etched using mask patterns crossing over the word lines as etching masks, thereby forming a plurality of cell diodes and a plurality of metal silicide electrodes which are two-dimensionally arrayed and separated from each other. In this case, the word lines may also have a low etch selectivity with respect to the second N-type semiconductor patterns. As a result, the word lines may be over-etched while the second N-type semiconductor patterns are etched in order to form the cell diodes. Therefore, the word lines between the cell diodes may be recessed, as shown in FIG. 2 of the U.S. Pat. No. 6,605,527 B2 to Dennison et al. Over-etching of the word lines may cause an increase in the electrical resistance of the word lines. According to Dennison et al., pockets (200 of FIG. 2) heavily doped with impurities are formed on the recessed regions of the word lines to prevent the electrical resistance of the word lines from being increased.

Each word line may act as a base region of a lateral bipolar transistor, which is parasitically formed between the adjacent phase change cells. In this case, if the electrical resistance of the word lines (that is, the base region) increases, current gain of the parasitic lateral bipolar transistor may increase. When the current gain of the parasitic lateral bipolar transistor increases, a voltage induced to a bit line electrically connected to a selected phase change cell may be temporarily unstable during a read mode for reading data of the selected phase change cell. This is because a large charging current corresponding to a collector current of the parasitic bipolar transistor may flow through a bit line of a non-selected phase change cell adjacent to the selected phase change cell. As a result, access time for reading out data stored in the selected phase change cell may increase to degrade characteristics of the phase change memory device.

Further, in the event that the current gain of the parasitic lateral bipolar transistor increases, the parasitic lateral bipolar transistor may operate during a program mode for storing data into the selected phase change cell to increase collector current flowing through the bit line of the non-selected phase change cell adjacent to the selected phase change cell. As a result, the non-selected phase change cell may also be programmed to alter the data of the non-selected phase change cell.

In order to decrease the electrical resistance of the word lines in a limited area, a thickness of the first N-type semiconductor layer can be increased. However, in the event that the thickness of the first N-type semiconductor layer is increased, the aspect ratio of the trench region may increase to degrade the reliability of the isolation layer in the trench region.

SUMMARY OF THE INVENTION

One embodiment of the present disclosure provides phase change memory devices that are suitable for improving reliability and electrical characteristics without degradation of integration density.

Another embodiment of the present disclosure provides methods of fabricating phase change memory devices that are capable of improving reliability and electrical characteristics without degradation of integration density.

In an aspect of the present disclosure, the present disclosure is directed to phase change memory devices employing cell diodes. The phase change memory devices comprise a semiconductor substrate of a first conductivity type and a plurality of parallel word lines disposed on the semiconductor substrate. The word lines have a second conductivity type different from the first conductivity type and have substantially flat top surfaces. A plurality of first semiconductor patterns is provided on the word lines. The first semiconductor patterns are one-dimensionally arrayed on each word line along a length direction of the word line. The first semiconductor patterns have the first conductivity type or the second conductivity type. Second semiconductor patterns having the first conductivity type are stacked on the first semiconductor patterns, respectively. An insulating layer is provided on the substrate having the second semiconductor substrate. The insulating layer fills gap regions between the word lines, gap regions between the first semiconductor patterns and gap regions between the second semiconductor patterns. A plurality of phase change material patterns are two-dimensionally arrayed on the insulating layer. The phase change material patterns are electrically connected to the second semiconductor patterns, respectively.

In some embodiments of the present disclosure, the first conductivity type and the second conductivity type may be a P-type and an N-type, respectively.

In other embodiments, interfaces between the semiconductor substrate and the word lines may have substantially the same height as a surface of the semiconductor substrate adjacent to the word lines.

In still other embodiments, a plurality of buffer lines may be provided between the word lines and the semiconductor substrate. The buffer lines may have the same conductivity type as the semiconductor substrate, and interfaces between the word lines and the buffer lines may be higher than interfaces between the insulating layer and the semiconductor substrate.

In yet other embodiments, the word lines may be semiconductor patterns grown using predetermined regions of the semiconductor substrate exposed by the insulating layer as a seed layer. Alternatively, the word lines may be semiconductor patterns which are obtained by crystallizing polycrystalline semiconductor patterns or amorphous semiconductor patterns on predetermined regions of the semiconductor substrate exposed by the insulating layer using a solid phase epitaxial technique.

In yet still other embodiments, the first semiconductor patterns may be semiconductor patterns grown using predetermined regions of the word lines exposed by the insulating layer as a seed layer, and the second semiconductor patterns may be semiconductor patterns grown using the first semiconductor patterns as a seed layer.

In further embodiments, the first and second semiconductor patterns may be semiconductor patterns formed using a solid phase epitaxial technique.

In yet further embodiments, the first semiconductor patterns may have an impurity concentration that is lower than impurity concentrations of the second semiconductor patterns and the word lines.

In still further embodiments, an interlayer insulating layer may be provided on the substrate having the phase change material patterns, and a plurality of bit lines may be disposed on the interlayer insulating layer. The bit lines may be electrically connected to the phase change material patterns through bit line contact holes penetrate the interlayer insulating layer.

In yet still further embodiments, the word lines, the first semiconductor patterns and the second semiconductor patterns may be single crystal semiconductors.

In still additional embodiments, first and second groups of switching elements may be provided to be adjacent to end portions of the word lines. The first and second groups of switching elements may be provided at the semiconductor substrate or epitaxial semiconductor body patterns on the semiconductor substrate. In addition, a plurality of main word lines may be disposed between the word lines when viewed from a top plan view. The main word lines transmit electric signals for controlling the switching elements. The first group of switching elements are electrically connected to odd word lines of the word lines respectively, and the second group of switching elements are electrically connected to even word lines of the word liens respectively. The first and second group of switching elements may be MOS access transistors. In this case, the main word lines are electrically connected to gate electrodes of the MOS access transistors respectively, and the word lines are electrically connected to drain regions of the MOS access transistors respectively. A plurality of conductive plugs may be provided in the insulating layer between the second semiconductor patterns and the phase change material patterns. In this case, the main word lines may pass through regions between the conductive plugs.

In another aspect of the present disclosure, the phase change memory devices comprise a first conductivity type semiconductor substrate and a lower molding layer provided on the semiconductor substrate. The lower molding layer has a plurality of parallel lower openings that expose predetermined regions of the semiconductor substrate. The lower openings are filled with word lines. The word lines have a second conductivity type different from the first conductivity type and have substantially flat top surfaces. The word lines and the lower molding layer are covered with an upper molding layer. The lower molding layer has a plurality of upper openings that expose predetermined regions of the word lines. First semiconductor patterns are provided in the upper openings. The first semiconductor patterns have the first conductivity type or the second conductivity type. Second semiconductor patterns are stacked on the first semiconductor patterns, and the second semiconductor patterns are provided in the upper openings. The second semiconductor patterns have the first conductivity type. A plurality of phase change material patterns is disposed over the second semiconductor patterns. The phase change material patterns are electrically connected to the second semiconductor patterns. Interfaces between the word lines and first semiconductor patterns have substantially the same height as interfaces between the word lines and the upper molding layer.

In still another aspect of the present disclosure, the phase change memory devices comprise a first conductivity type semiconductor substrate and a first molding layer provided on the semiconductor substrate. The first molding layer has a plurality of first parallel openings that expose predetermined regions of the semiconductor substrate. Lower regions of the first openings are filled with a plurality of word lines. The word lines have a second conductivity type different from the first conductivity type and have substantially flat top surfaces. A plurality of separating walls is provided in upper regions of the first openings. The separating walls provide a plurality of second openings exposing predetermined regions of the word lines. The separating walls are composed of a second molding layer having an etch selectivity with respect to the first molding layer. First semiconductor patterns are provided in the second openings. The first semiconductor patterns have the first conductivity type or the second conductivity type. Second semiconductor patterns are stacked on the first semiconductor patterns, and the second semiconductor patterns are also provided in the second openings. The second semiconductor patterns have the first conductivity type. A plurality of phase change material patterns is disposed over the second semiconductor patterns, and the phase change material patterns are electrically connected to the second semiconductor patterns respectively. Interface between the word lines and the first semiconductor patterns have substantially the same height as interfaces between the word lines and the separating walls.

In yet another aspect of the present disclosure, the present disclosure is directed to methods of fabricating a phase change memory device. The methods comprise forming a plurality of parallel word lines on a semiconductor substrate of a first conductivity type and forming a word line isolation layer to fill gap regions between the word lines. The word lines are formed to have a second conductivity type different from the first conductivity type. An upper molding layer is formed on the word lines and the word line isolation layer. The upper molding layer is patterned to form a plurality of upper openings that expose predetermined regions of the word lines. First semiconductor patterns and second semiconductor patterns are sequentially formed in the upper openings. The first semiconductor patterns are formed to have the first conductivity type or the second conductivity type, and the second semiconductor patterns are formed to have the first conductivity type. A plurality of phase change material patterns electrically connected to the second semiconductor patterns are formed on the substrate having the second semiconductor patterns.

In some embodiments of the present disclosure, forming the word lines and the word line isolation layer may comprises providing a semiconductor substrate of a first conductivity type, forming an upper epitaxial layer having a second conductivity type different from the first conductivity type on the semiconductor substrate, patterning the upper epitaxial semiconductor layer to form a plurality of parallel upper epitaxial semiconductor patterns, forming an insulating layer on the substrate having the upper epitaxial semiconductor patterns, and planarizing the insulating layer to expose top surfaces of the upper epitaxial semiconductor patterns.

In other embodiments, buffer lines may be formed under the word lines. In this case, formation of the buffer lines, the word lines and the word line isolation layer may comprise providing a semiconductor substrate of a first conductivity type, sequentially forming a lower epitaxial semiconductor layer of the first conductivity type and an upper epitaxial semiconductor layer of a second conductivity type different from the first conductivity type on the semiconductor substrate, patterning the upper epitaxial semiconductor layer and the lower epitaxial semiconductor layer to form lower epitaxial semiconductor patterns and upper epitaxial semiconductor patterns which are sequentially stacked, forming an insulating layer on the substrate having the upper epitaxial semiconductor patterns, and planarizing the insulating layer to expose top surfaces of the upper epitaxial semiconductor patterns.

In yet other embodiments, formation of the word lines and the word line isolation layer may comprise forming a lower molding layer on a semiconductor substrate of a first conductivity type, patterning the lower molding layer to form a plurality of parallel lower openings that expose predetermined regions of the semiconductor substrate, and forming a plurality of semiconductor lines in the lower openings using a selective epitaxial growth technique or a solid phase epitaxial technique. The semiconductor lines may be formed to have a second conductivity type different from the first conductivity type. Prior to formation of the semiconductor lines, a plurality of buffer lines may be formed in lower regions of the lower openings using a selective epitaxial growth technique or a solid phase epitaxial technique. The buffer lines may be formed to have the first conductivity type.

In still other embodiments, formation of the word lines and the word line isolation layer may comprise providing a semiconductor substrate of a first conductivity type, forming a trench isolation layer in a predetermined region of the semiconductor substrate to define a plurality of parallel active regions, and implanting impurity ions of a second conductivity type different from the first conductivity type into the active regions to form second conductivity type word lines. Before or after implantation of the impurity ions having the second conductivity type, impurity ions having the first conductivity type may be implanted into the active regions to form buffer lines having the first conductivity type under the word lines.

In yet still other embodiments, the first and second semiconductor patterns may be formed using a selective epitaxial growth technique or a solid phase epitaxial technique.

In further embodiments, a plurality of conductive plugs may be formed on the second semiconductor patterns, respectively. The conductive plugs as well as the first and second semiconductor patterns may be formed in the upper openings.

In yet further embodiments, the first conductivity type and the second conductivity type may be a P-type and an N-type, respectively.

In still further embodiments, the semiconductor substrate may be a single crystal semiconductor substrate, and the word lines, the first semiconductor patterns and the second semiconductor patterns may be single crystal semiconductor patterns.

In yet still further embodiments, the first semiconductor patterns may have an impurity concentration lower than that of the second semiconductor patterns and the word lines.

In yet additional embodiments, an interlayer insulating layer may be formed on the substrate having the phase change material patterns, and the interlayer insulating layer may be patterned to form bit line contact holes exposing the phase change material patterns. In addition, a plurality of bit lines covering the bit line contact holes may be formed on the interlayer insulating layer. The bit lines may be formed to cross over the word lines.

In yet still another aspect of the present disclosure, the methods comprise forming a first molding layer on a semiconductor substrate of a first conductivity type and patterning the first molding layer to form first openings that expose predetermined regions of the semiconductor substrate. A plurality of word lines is formed in lower regions of the first openings. The word lines are formed to have a second conductivity type different from the first conductivity type. Second molding layer patterns are formed in upper regions of the first openings. The second molding layer patterns may be formed of an insulating layer having an etch selectivity with respect to the first molding layer. The second molding layer patterns are patterned to form isolation patterns which provide a plurality of second openings that expose predetermined regions of the word lines. First semiconductor patterns and second semiconductor patterns are sequentially formed in the second openings. The first semiconductor patterns are formed to have the first conductivity type or the second conductivity type, and the second semiconductor patterns are formed to have the first conductivity type. A plurality of phase change material patterns electrically connected to the second semiconductor patterns are formed on the substrate having the second semiconductor patterns.

BRIEF DESCRIPTION OF THE DRAWINGS

The above and other features and advantages of the present disclosure will become more apparent by describing in detail exemplary embodiments thereof with reference to the attached drawings in which:

FIGS. 8A to 11A are cross sectional views taken along the line I-I' of FIG. 3 to illustrate methods of fabricating a phase change memory device according to embodiments of the present disclosure;

FIGS. 8B to 11B are cross sectional views taken along the line II-II' of FIG. 3 to illustrate methods of fabricating a phase change memory device according to embodiments of the present disclosure;

FIGS. 12A to 15A are cross sectional views taken along the line I-I' of FIG. 3 to illustrate methods of fabricating a phase change memory device according to other embodiments of the present disclosure; and FIGS. 12B to 15B are cross sectional views taken along the line II-II' of FIG. 3 to illustrate methods of fabricating a phase change memory device according to other embodiments of the present disclosure.

DETAILED DESCRIPTION OF PREFERRED EMBODIMENTS

Figure 1:
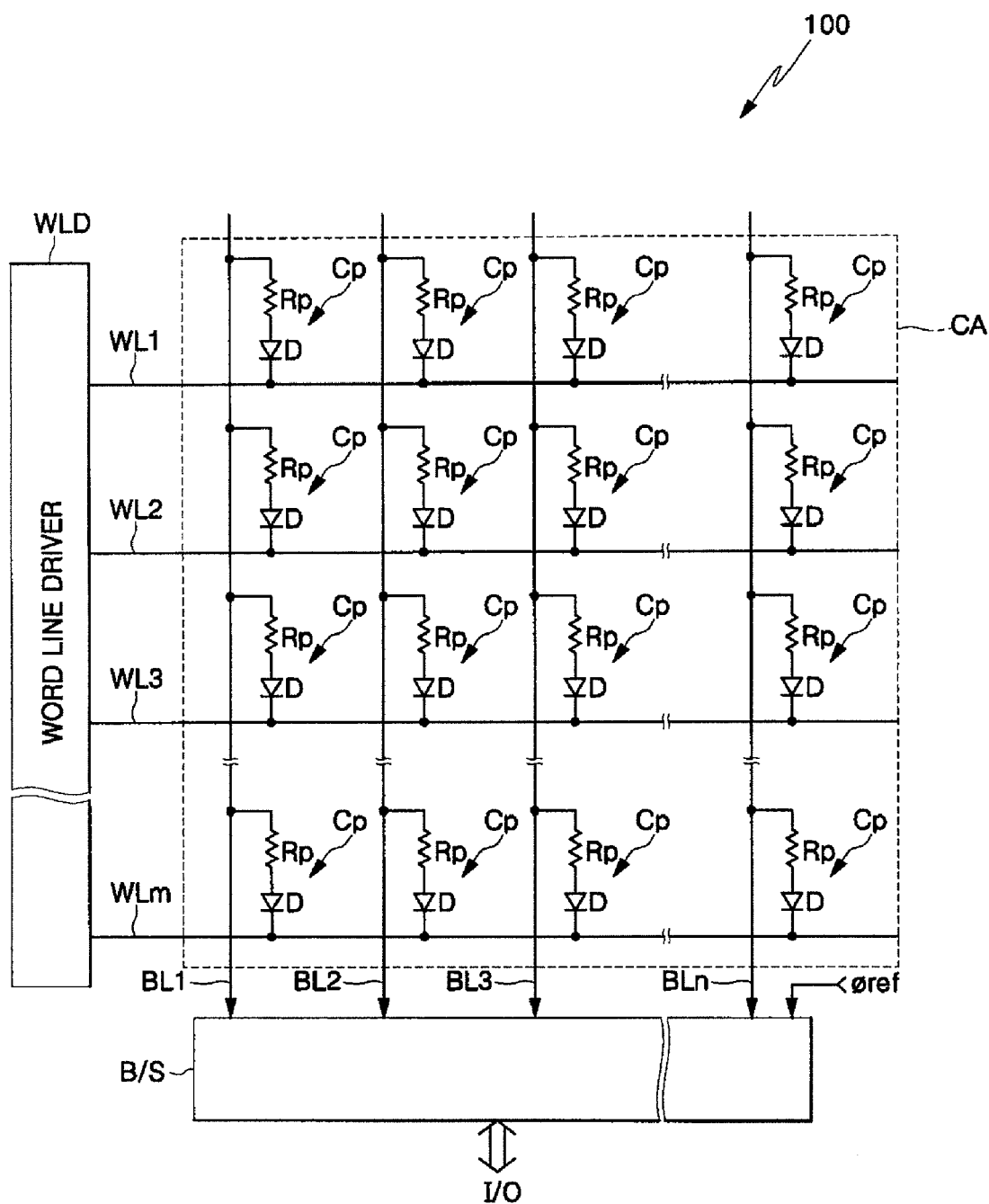
FIG. 1 is an exemplary block diagram illustrating a phase change memory device employing cell diodes.

Exemplary embodiments of the present disclosure will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, lengths and thicknesses of layers and regions may be exaggerated for clarity. Like reference numerals in the drawings may denote like elements.

FIG. 1 is an exemplary block diagram illustrating a phase change memory device including phase change memory cells that employ cell diodes. The phase change memory device is indicated generally by the reference numeral 100.

Referring to FIG. 1, the phase change memory device 100 includes a cell array region CA and a peripheral circuit region. The cell array region CA includes n-number of bit lines BL1, BL2, BL3, . . . , BLn and m-number of word lines WL1, WL2, WL3, . . . , WLm intersecting the bit lines BL1, BL2, BL3, . . . , BLn. A plurality of phase change memory cells Cp, which are two-dimensionally arrayed, are each disposed at cross points of the bit lines BL1, BL2, BL3, . . . , BLn and the word lines WL1, WL2, WL3, . . . , WLm. Each of the phase change memory cells Cp includes a phase change material pattern Rp and a cell diode D, which are electrically connected in series.

A P-type semiconductor of the cell diode D is electrically connected to one end of the phase change material pattern Rp, and the other end of the phase change material pattern Rp is electrically connected to one of the bit lines BL1, BL2, BL3, . . . , BLn. In addition, an N-type semiconductor of the cell diode D is electrically connected to one of the word lines WL1, WL2, WL3, . . . , WLm. The word lines WL1, WL2, WL3, . . . , WLm are connected to a word line driver WLD in the peripheral circuit region, and the word line driver WLD selects one of the word lines WL1, WL2, WL3, . . . , WLm during a read mode or a program mode.

The bit lines BL1, BL2, BL3, . . . , BLn are electrically connected to a core circuit B/S composed of a bit line driver and a sense amplifier unit in the peripheral circuit region. The bit line driver selects at least one of the bit lines BL1, BL2, BL3, . . . , BLn. The number of bit lines selected by the bit line driver is determined according to a bit organization of the phase change memory device. For example, when the bit organization of the phase change memory device is "×4", the bit line driver selects four bit lines among the bit lines BL1, BL2, BL3, . . . , BLn. Here, the bit organization means the number of data that are simultaneously output at one time. In addition, the sense amplifier unit compares electrical signals, such as voltages, induced at the selected bit lines with a reference signal ϕref, to determine whether each of the bit line signals corresponds to a logic "0" or a logic "1" and transmits the bit line signals to I/O pads.

According to the phase change memory device shown in FIG. 1, several tens or more of phase change memory cells may be connected to a single word line. In this case, access time for reading out data stored in the farthest phase change cell away from the word line driver WLD may significantly increase due to electrical resistance and parasitic capacitance such as loading capacitance of the word line. Therefore, if the number of the phase change memory cells connected to the single word line is reduced by dividing the cell array region CA into a plurality of cell blocks, the access time for reading out data stored in the selected phase change cell can be reduced.

Figure 2:
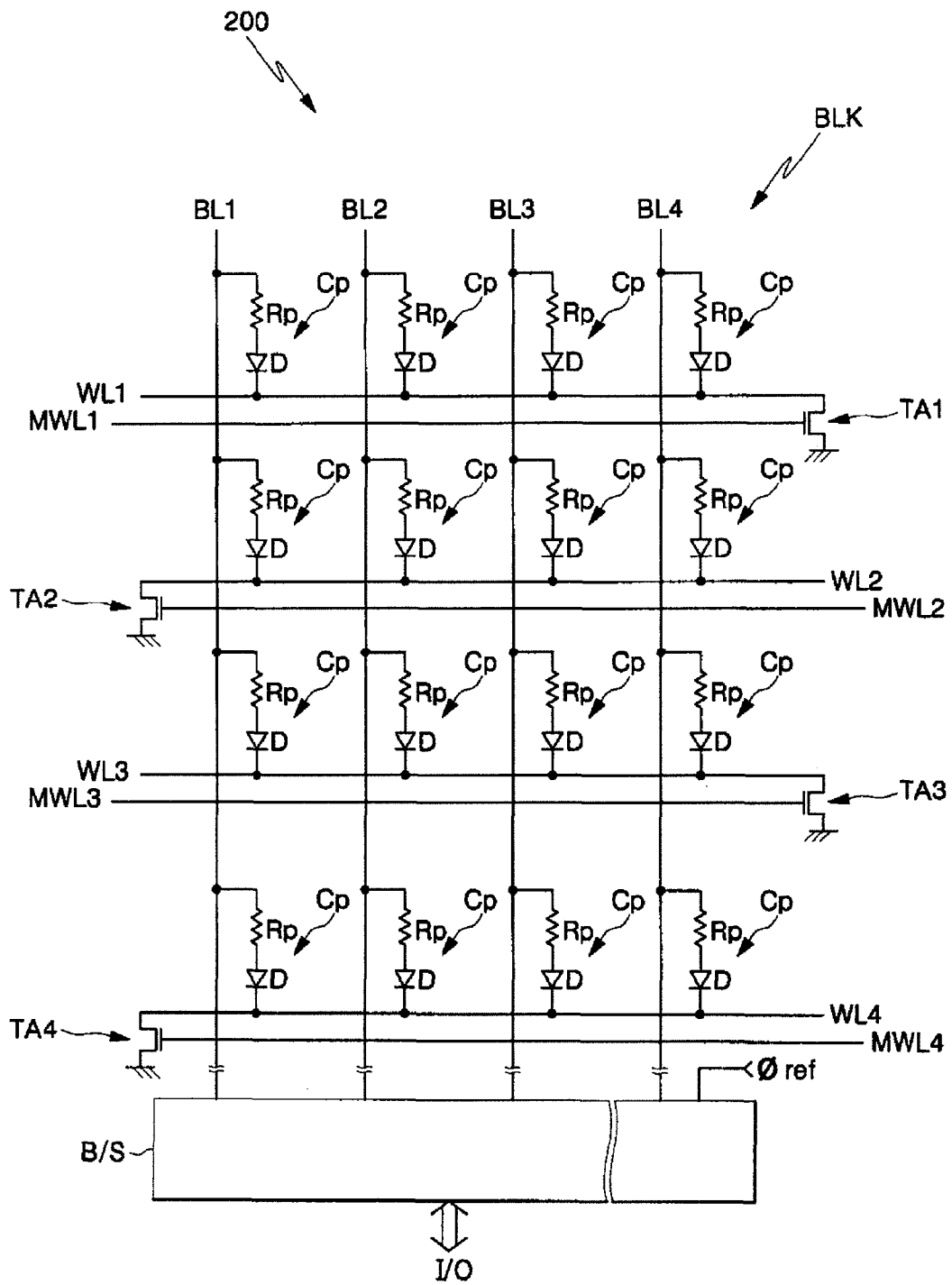
FIG. 2 is an exemplary schematic view illustrating a cell block of a phase change memory device employing cell diodes and selection transistors.

FIG. 2 is a schematic view illustrating one cell block of a plurality of the cell blocks and a core circuit connected thereto. The cell block is indicated generally by the reference numeral 200.

Referring to FIG. 2, the exemplary cell block 200 or BLK may include four bit lines BL1, BL2, BL3 and BL4 and four word lines WL1, WL2, WL3 and WL4. However, the numbers of bit lines and the word lines are not limited to four, but the numbers may be greater than four in alternate embodiments. The four word lines WL1, WL2, WL3 and WL4 are disposed to cross the four bit lines BL1, BL2, BL3 and BL4. Sixteen phase change memory cells Cp are disposed at cross points of the bit lines BL1, BL2, BL3 and BL4 and the word lines WL1, WL2, WL3 and WL4. The phase change memory cells Cp are the same as described with reference to FIG. 1.

The word lines WL1, WL2, WL3 and WL4 may be connected to four block selection switching elements, and four main word lines MWL1, MWL2, MWL3 and MWL4 controlling the block selection switching elements may be disposed adjacent to the word lines WL1, WL2, WL3 and WL4, respectively. That is, the main word lines MWL1, MWL2, MWL3 and MWL4 may be disposed between the word lines WL1, WL2, WL3 and WL4. The block selection switching elements may be MOS access transistors TA1, TA2, TA3 and TA4. In this case, the first to fourth word lines WL1, WL2, WL3 and WL4 may be connected to drain regions of the first to fourth MOS access transistors TA1, TA2, TA3 and TA4, respectively, and the first to fourth main word lines MWL1, MWL2, MWL3 and MWL4 may be connected to gate electrodes of the first to fourth MOS access transistors TA1, TA2, TA3 and TA4, respectively. In addition, source regions of the MOS access transistors TA1, TA2, TA3 and TA4 may be grounded.

The first and third MOS access transistors TA1 and TA3, that is, a first group of MOS access transistors may be disposed at the right side of the cell block BLK and the second and fourth MOS access transistors TA2 and TA4, that is, a second group of MOS access transistors may be disposed at the left side of the cell block BLK, as shown in FIG. 2. The bit lines BL1, BL2, BL3 and BL4 are connected to the core circuit B/S, as described with reference to FIG. 1.

In the cell block BLK shown in FIG. 2, when one of the main word lines MWL1, MWL2, MWL3 and MWL4 is selected, one of the word lines WL1, WL2, WL3 and WL4 may be selected. For example, in the event that the second main word line MWL2 is selected, the second MOS access transistor TA2 is turned on and the second word line WL2 is selected.

Figure 3:
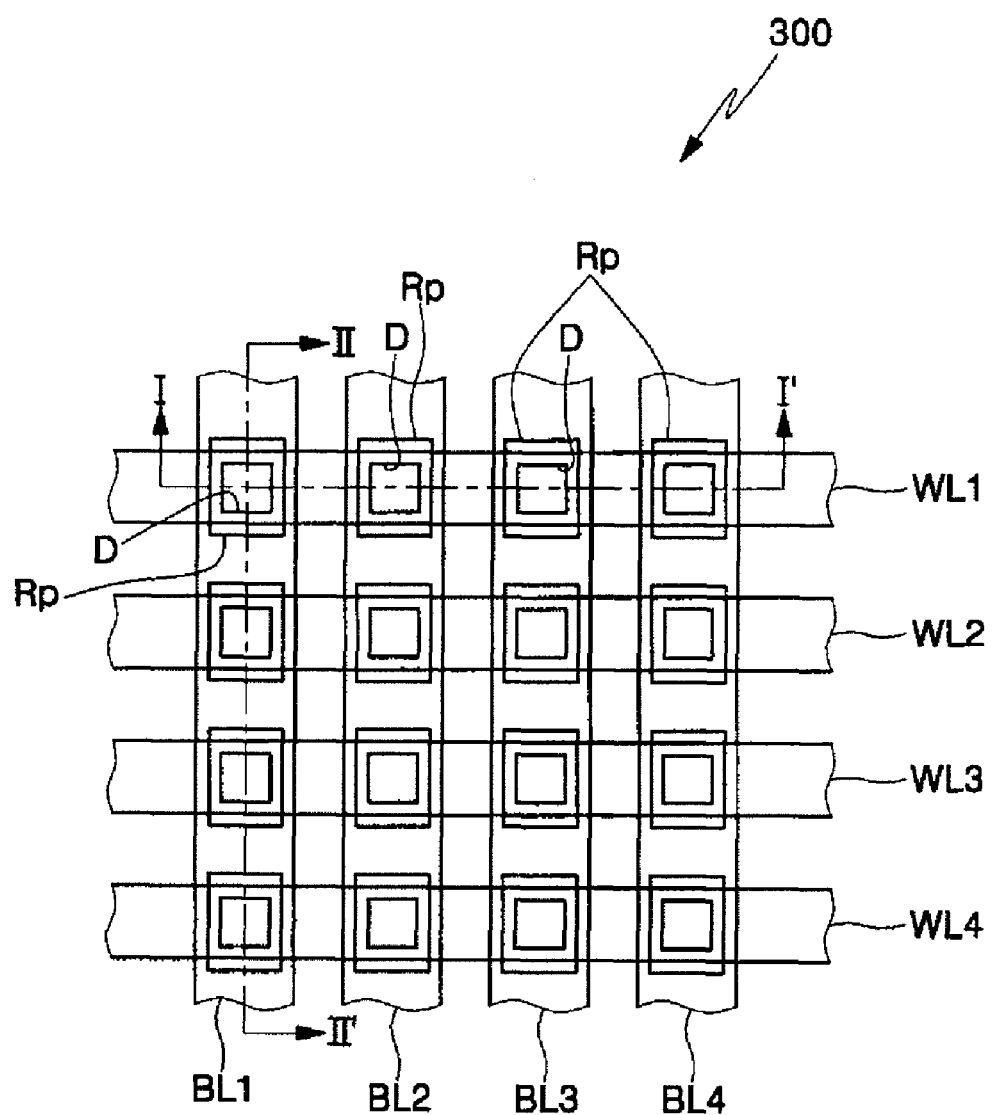
FIG. 3 is a plan view illustrating a portion of a cell array region of a phase change memory device according to an embodiment of the present disclosure.
Figure 4:
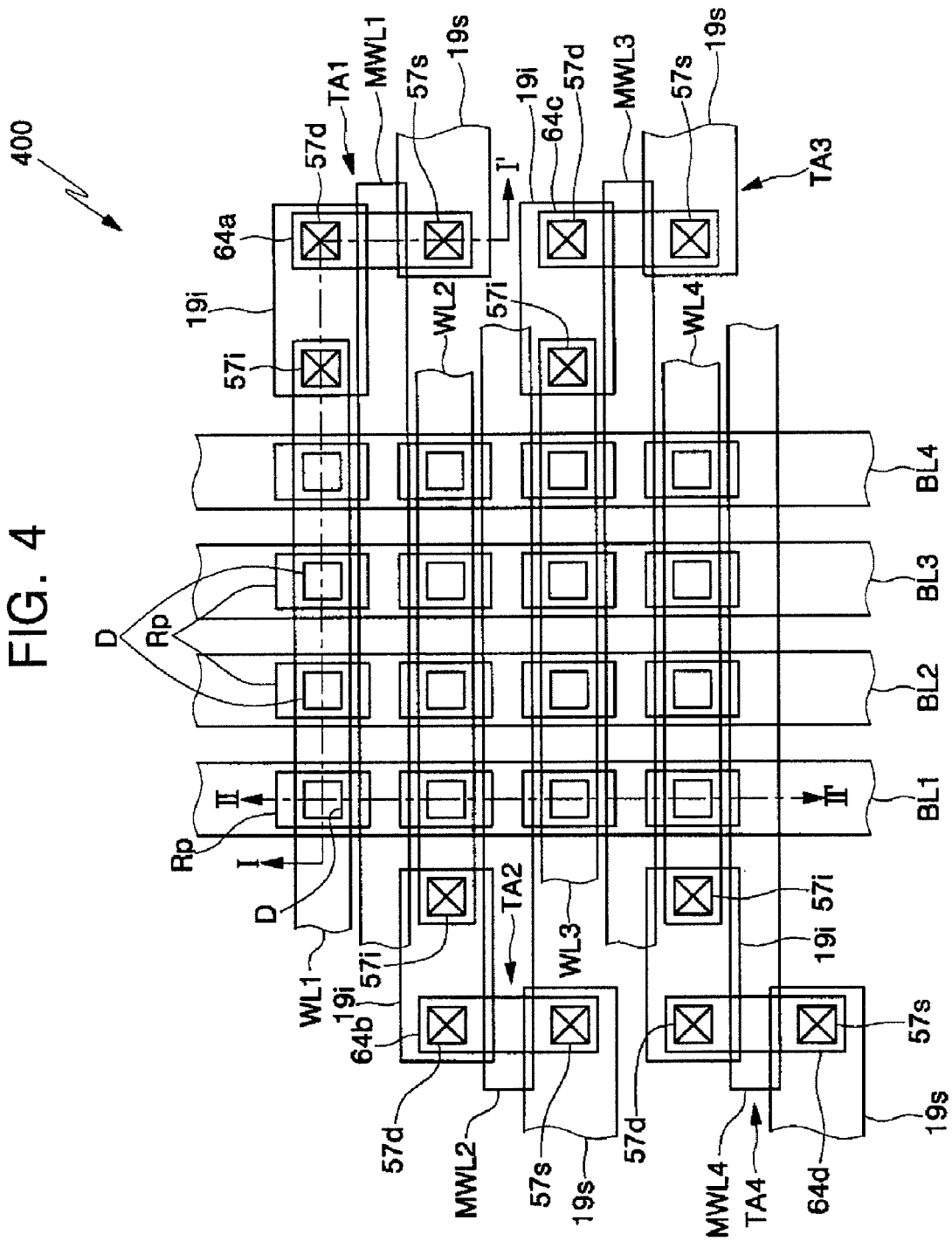
FIG. 4 is a plan view illustrating a portion of a cell array region of a phase change memory device according to another embodiment of the present disclosure.

FIG. 3 is a plan view illustrating a portion 300 of a cell array region of a phase change memory device according to an embodiment of the present disclosure, and FIG. 4 is a plan view illustrating a portion 400 of a cell array region of a phase change memory device according to another embodiment of the present disclosure. Namely, FIG. 3 is a plan view illustrating a portion 300 of the cell array region CA of FIG. 1, and FIG. 4 is a plan view 400 of the cell block BLK shown in FIG. 2.

Figure 5A:
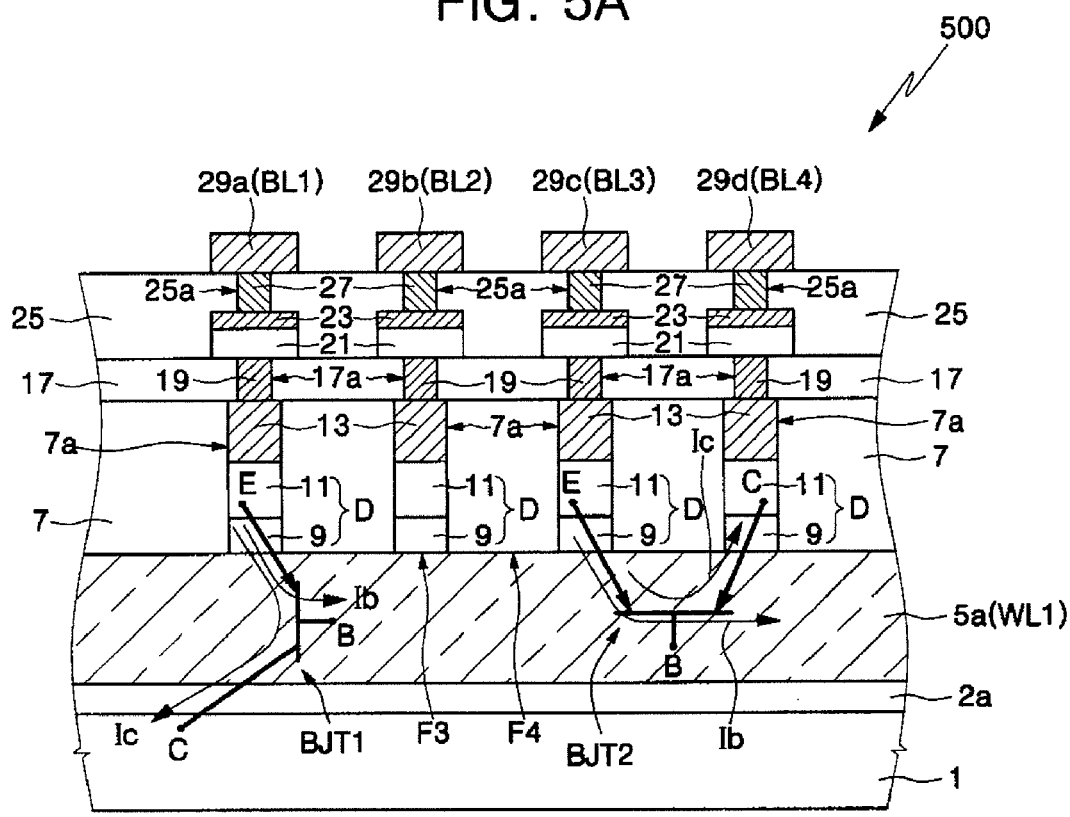
FIG. 5A is a cross sectional view taken along the line I-I' of FIG. 3 to illustrate a cell array region of a phase change memory device according to an embodiment of the present disclosure.
Figure 5B:
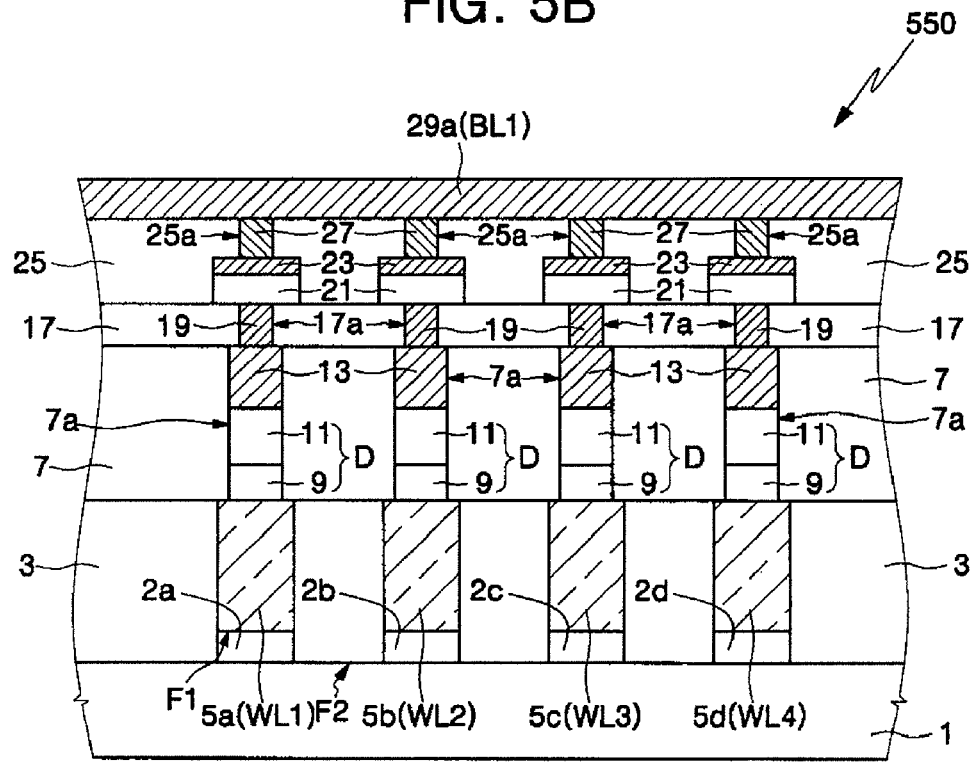
FIG. 5B is a cross sectional view taken along the line II-II' of FIG. 3 to illustrate a cell array region of a phase change memory device according to an embodiment of the present disclosure.

FIG. 5A is a cross sectional view taken along the line I-I' of FIG. 3 to illustrate a cell array region 500 of a phase change memory device according to an embodiment of the present disclosure, and FIG. 5B is a cross sectional view taken along the line II-II' of FIG. 3 to illustrate a cell array region 550 of a phase change memory device according to an embodiment of the present disclosure.

Referring to FIGS. 3, 5A and 5B, a lower molding layer 3 is disposed on a semiconductor substrate 1 of a first conductivity type. The lower molding layer 3 may be an insulating layer such as a silicon oxide layer, and the first conductivity type may be a P-type. The lower molding layer 3 may include a plurality of parallel lower openings that expose predetermined regions of the semiconductor substrate 1. The lower openings are filled with a plurality of word lines, that is, first to fourth word lines 5a, 5b, 5c and 5d (or WL1, WL2, WL3 and WL4 in FIG. 3) having a second conductivity type different from the first conductivity type. When the first conductivity type is a P-type, the second conductivity type may be an N-type. The word lines 5a, 5b, 5c and 5d may be epitaxial semiconductor patterns which are grown using the semiconductor substrate 1 exposed by the lower openings as a seed layer. Alternatively, the word lines 5a, 5b, 5c and 5d may be semiconductor patterns formed using a solid phase epitaxial technique. Therefore, in the event that the semiconductor substrate 1 is a single crystal semiconductor substrate, the word lines 5a, 5b, 5c and 5d may also be single crystal semiconductor patterns.

First to fourth buffer lines 2a, 2b, 2c and 2d may be provided under the first to fourth word lines 5a, 5b, 5c and 5d, respectively. The buffer lines 2a, 2b, 2c and 2d may be epitaxial patterns having the same conductivity type as the semiconductor substrate 1. That is, the buffer lines 2a, 2b, 2c and 2d may have the first conductivity type. Alternatively, the buffer lines 2a, 2b, 2c and 2d may correspond to portions protruding from the semiconductor substrate 1. Namely, the buffer lines 2a, 2b, 2c and 2d may correspond to extensions of the semiconductor substrate 1. The buffer lines 2a, 2b, 2c and 2d can improve electrical isolation characteristics of the adjacent word lines 5a, 5b, 5c and 5d. When the buffer lines 2a, 2b, 2c and 2d are provided, bottom surfaces of the word lines 5a, 5b, 5c and 5d (e.g., first interfaces F1 between the buffer lines 2a, 2b, 2c and 2d and the word lines 5a, 5b, 5c and 5d) may be higher than second interfaces F2 between the lower molding layer 3 and the semiconductor substrate 1.

When the buffer lines 2a, 2b, 2c and 2d are not provided, the first interfaces F1 between the word lines 5a, 5b, 5c and 5d and the semiconductor substrate 1 may have substantially the same height as the second interfaces F2. In addition, the word lines 5a, 5b, 5c and 5d may be heavily doped semiconductor patterns having an impurity concentration which is higher than $1 \times 10^{19}$ atoms per square centimeter.

An upper molding layer 7 is provided on the word lines 5a, 5b, 5c and 5d and the lower molding layer 3. The upper molding layer 7 may be the same material layer as the lower molding layer 3. Alternatively, the upper molding layer 7 may be a different material layer from the lower molding layer 3. For example, in the event that the lower molding layer 3 is a silicon oxide layer, the upper molding layer 7 may be a silicon nitride layer. Similarly, when the lower molding layer 3 is a silicon nitride layer, the upper molding layer 7 may be a silicon oxide layer.

The upper molding layer 7 includes a plurality of upper openings 7a that expose predetermined regions of the word lines 5a, 5b, 5c and 5d. Each of lower regions of the upper openings 7a is filled with a first semiconductor pattern 9 and a second semiconductor pattern 11, which are sequentially stacked. The first semiconductor patterns 9 may have the same conductivity type as the word lines 5a, 5b, 5c and 5d; and the second semiconductor patterns 11 may have a different conductivity type from the conductivity type of the first semiconductor patterns 9. For example, the first semiconductor patterns 9 and the second semiconductor patterns 11 may have the second conductivity type and the first conductivity type, respectively. Therefore, the first semiconductor pattern 9 and the second semiconductor pattern 11 thereon constitute a cell diode D. In this case, it is preferable that the first semiconductor patterns 9 have an impurity concentration that is lower than that of the word lines 5a, 5b, 5c and 5d. This is for reducing leakage currents that flow through reverse biased cell diodes. The second semiconductor patterns 11 may have an impurity concentration that is higher than that of the first semiconductor patterns 9.

In other embodiments, the first and second semiconductor patterns 9 and 11 may have a conductivity type which is different from that of the word lines 5a, 5b, 5c and 5d. Namely, the first semiconductor patterns 9 and the second semiconductor patterns 11 may have the first conductivity type. In this case, the cell diodes D are composed of the first semiconductor patterns 9 and the word lines 5a, 5b, 5c and 5d, and the first semiconductor patterns 9 may have an impurity concentration lower than those of the word lines 5a, 5b, 5c and 5d and the second semiconductor patterns 11.

The first semiconductor patterns 9 may be epitaxial semiconductor patterns which are grown using the word lines 5a, 5b, 5c and 5d exposed by the upper openings 7a as seed layers, and the second semiconductor patterns 11 may be epitaxial semiconductor patterns which are grown using the first semiconductor patterns 9 as seed layers. Alternatively, the first and second semiconductor patterns 9 and 11 may be semiconductor patterns formed using a solid phase epitaxial technique. Therefore, when the word lines 5a, 5b, 5c and 5d are single crystal semiconductor patterns, the first and second semiconductor patterns 9 and 11 may also be single crystal semiconductor patterns.

Third interfaces F3 between the first semiconductor patterns 9 and the word lines 5a, 5b, 5c and 5d may have substantially the same height as fourth interfaces F4 between the upper molding layer 7 and the word lines 5a, 5b, 5c and 5d.

The upper regions of the upper openings 7a may be filled with a plurality of conductive plugs 13. The conductive plugs 13 may be metal plugs exhibiting ohmic contact with respect to the second semiconductor patterns 11. For example, the conductive plugs 13 may be tungsten plugs. The conductive plugs 13 need not be provided. In this case, the upper openings 7a may be completely filled with the cell diodes D.

An insulating layer 17 may be provided on the conductive plugs 13 and the upper molding layer 7, and phase change material patterns 21 (Rp in FIG. 3) may be two-dimensionally arrayed on the insulating layer 17. The phase change material patterns 21 may directly contact the conductive plugs 13 through contact holes 17a penetrating the insulating layer 17. In this case, the phase change material patterns 21 have a confined configuration. Alternatively, the phase change material patterns 21 may be electrically connected to the conductive plugs 3 through lower electrodes 19 filling the contact holes 17a.

Upper electrodes 23 may be stacked on the phase change material patterns 21. An interlayer insulating layer 25 is provided on the substrate having the upper electrodes 23, and a plurality of parallel bit lines 29a, 29b, 29c and 29d (BL1, BL2, BL3 and BL4 in FIG. 3) are disposed on the interlayer insulating layer 25. The bit lines 29a, 29b, 29c and 29d are disposed to cross over the word lines 5a, 5b, 5c and 5d. The bit lines 29a, 29b, 29c and 29d may directly contact the upper electrodes 23 through a plurality of bit line contact holes 25a penetrating the interlayer insulating layer 25. Alternatively, the bit lines 29a, 29b, 29c and 29d may be electrically connected to the upper electrodes 23 through bit line contact plugs 27 filling the bit line contact holes 25a.

According to embodiment shown in FIGS. 5A and 5B, a pair of adjacent cell diodes D and the word line connected thereto (for example, the first word line 5a) may constitute a parasitic lateral bipolar transistor BJT2. In this case, the second semiconductor patterns 11 of the adjacent cell diodes D act as an emitter E and a collector C of the parasitic lateral bipolar transistor BJT2 respectively, and the first word line 5a acts as a base B of the parasitic lateral bipolar transistor BJT2. Therefore, even though the third bit line 29c connected to the emitter E is selected and the fourth bit line 29d connected to the collector C is not selected, the parasitic lateral bipolar transistor BJT2 can operate to temporarily generate a collector current Ic that flows toward the non-selected fourth bit line 29d. In this case, a base current Ib flowing through the word line 5a may temporarily decrease. The collector current Ic is a current for charging a loading capacitor or a parasitic capacitor of the fourth bit line 29d. If an amount of the collector current Ic is large, an electrical signal induced to the selected bit line (that is, the third bit line 29c) may be unstable to disturb a successful read operation of the phase change memory device.

However, according to the embodiment, the word lines 5a, 5b, 5c and 5d have substantially flat surfaces. That is, any recessed regions are not provided at the surfaces of the word lines 5a, 5b, 5c and 5d between the cell diodes D. Therefore, electrical resistance of the word lines 5a, 5b, 5c and 5d can be minimized. As a result, the cell array region of the phase change memory device according to the embodiment is suitable to suppress operation of the parasitic lateral bipolar transistor BJT2.

Furthermore, the phase change cell array region according to the embodiment may provide a parasitic vertical bipolar transistor BJT1 as shown in FIG. 5a. For example, the parasitic vertical bipolar transistor BJT1 may include the semiconductor substrate 1, the first word line 5a and the second semiconductor pattern 11 of the cell diode D connected to the first word line 5a. In this case, the semiconductor substrate 1 and the first word line 5a serve as a collector C and a base B of the parasitic vertical bipolar transistor BJT1 respectively, and the second semiconductor pattern 11 serves as an emitter E of the parasitic vertical bipolar transistor BJT1. If current gain of the parasitic vertical bipolar transistor BJT1 increases, a collector current Ic flowing into the semiconductor substrate 1 may also increase. Accordingly, electrical characteristics of MOS transistors formed in a peripheral circuit region of the semiconductor substrate 1 may become unstable. However, according to the embodiment, the electrical resistance of the word lines 5a, 5b, 5c and 5d can be minimized, thereby significantly reducing the current gain of the parasitic vertical bipolar transistor BJT1.

Figure 6A:
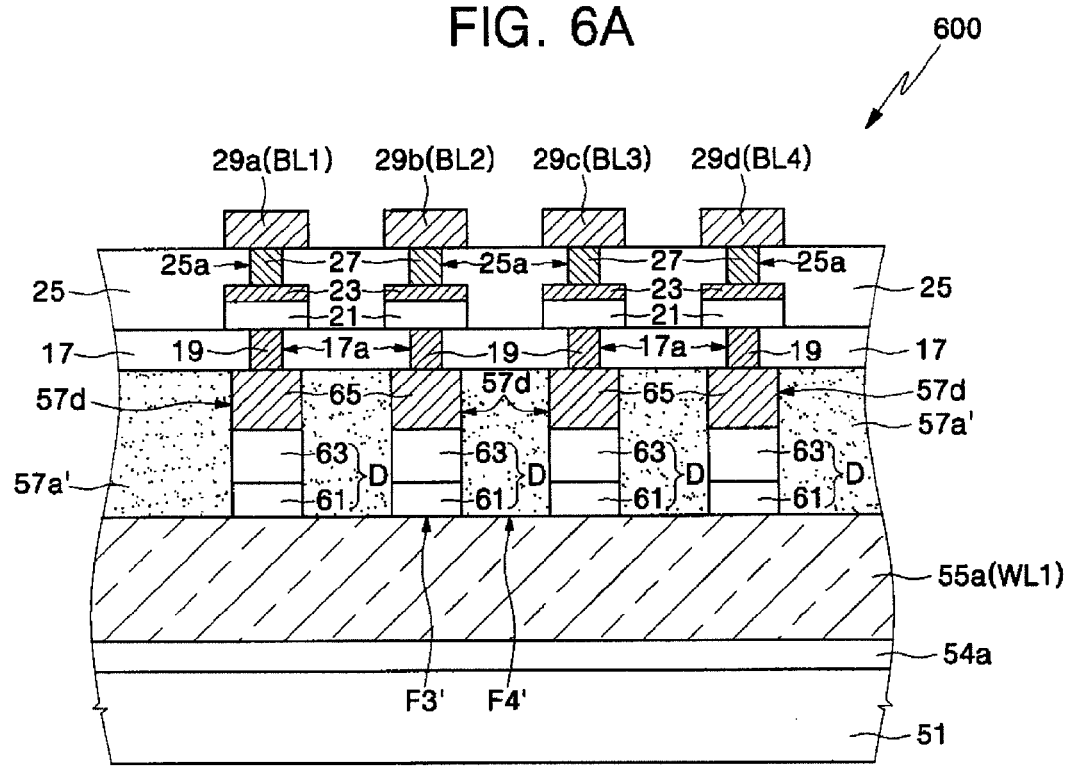
FIG. 6A is a cross sectional view taken along the line I-I' of FIG. 3 to illustrate a cell array region of a phase change memory device according to another embodiment of the present disclosure.
Figure 6B:
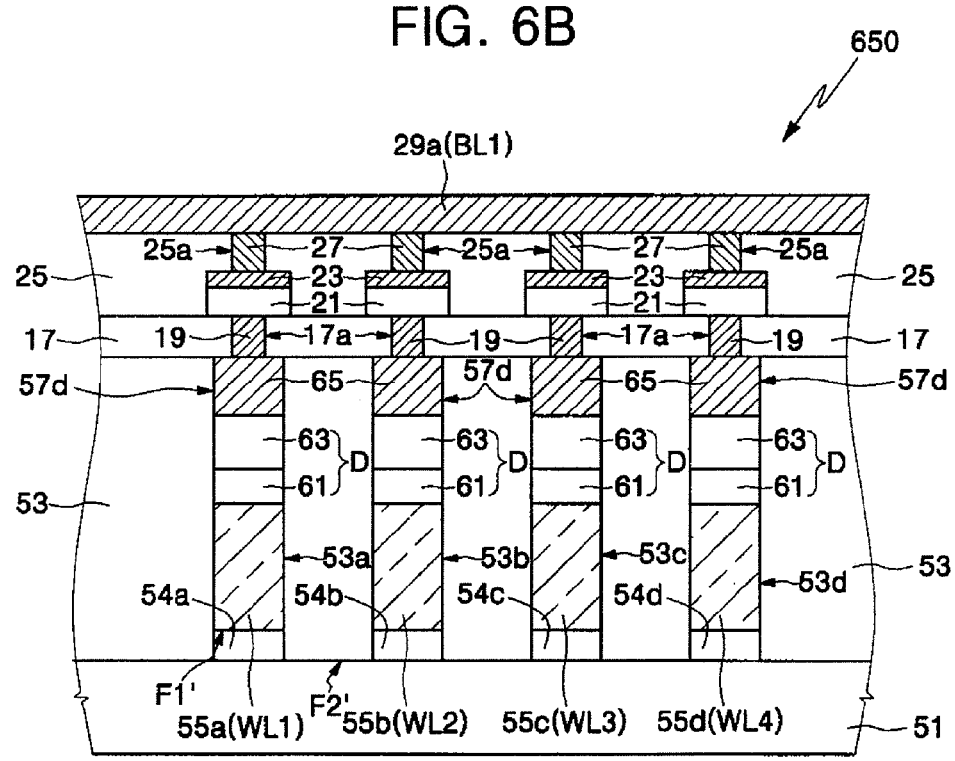
FIG. 6B is a cross sectional view taken along the line II-II' of FIG. 3 to illustrate a cell array region of a phase change memory device according to another embodiment of the present disclosure.

FIG. 6A is a cross sectional view taken along the line I-I' of FIG. 3 to illustrate a cell array region 600 of a phase change memory device according to another embodiment of the present disclosure, and FIG. 6B is a cross sectional view taken along line the II-II' of FIG. 3 to illustrate a cell array region 650 of a phase change memory device according to another embodiment of the present disclosure.

Referring to FIGS. 3, 6A and 6B, a first molding layer 53 is provided on a semiconductor substrate 51 of a first conductivity type. The first conductivity type may be a P-type, and the first molding layer 53 may be an insulating layer such as a silicon oxide layer. The first molding layer 53 may have a plurality of first parallel openings 53a, 53b, 53c and 53d that expose predetermined regions of the semiconductor substrate 51. Lower regions of the first openings 53a, 53b, 53c and 53d are filled with a plurality of word lines, that is, first to fourth word lines 55a, 55b, 55c and 55d (or WL1, WL2, WL3 and WL4 in FIG. 3) that have a second conductivity type different from the first conductivity type. In the event that the first conductivity type is a P-type, the second conductivity type may be an N-type. The word lines 55a, 55b, 55c and 55d may be epitaxial semiconductor patterns which are grown using the semiconductor substrate 51 exposed by the first openings 53a, 53b, 53c and 53d as a seed layer. Alternatively, the word lines 55a, 55b, 55c and 55d may be semiconductor patterns formed using a solid phase epitaxial technique. Therefore, when the semiconductor substrate 51 is a single crystal semiconductor substrate, the word lines 55a, 55b, 55c and 55d may also be single crystal semiconductor patterns.

First to fourth buffer lines 54a, 54b, 54c and 54d may be disposed under the first to fourth word lines 55a, 55b, 55c and 55d, respectively. The buffer lines 54a, 54b, 54c and 54d may be epitaxial semiconductor patterns having the same conductivity type as the semiconductor substrate 51. That is, the buffer lines 54a, 54b, 54c and 54d may have the first conductivity type. The buffer lines 54a, 54b, 54c and 54d can improve electrical isolation characteristics of the adjacent word lines 55a, 55b, 55c and 55d. When the buffer lines 54a, 54b, 54c and 54d are provided, bottom surfaces of the word lines 55a, 55b, 55c and 55d (e.g., first interfaces F1' between the buffer lines 54a, 54b, 54c and 54d and the word lines 55a, 55b, 55c and 55d) may be higher than second interfaces F2' between the first molding layer 53 and the semiconductor substrate 51.

In other embodiments, when the buffer lines 54a, 54b, 54c and 54d are not provided, the first interfaces F1' between the word lines 55a, 55b, 55c and 55d and the semiconductor substrate 51 may have substantially the same height as the second interfaces F2' between the first molding layer 53 and the semiconductor substrate 51. In addition, the word lines 55a, 55b, 55c and 55d may be heavily doped semiconductor patterns having an impurity concentration which is higher than $1 \times 10^{19}$ atoms per square centimeter.

A plurality of separating walls 57a' are provided in upper regions of the first openings 53a, 53b, 53c and 53d. Namely, the separating walls 57a' are one-dimensionally arrayed on each of the word lines 55a, 55b, 55c and 55d. Therefore, predetermined regions of the word lines 55a, 55b, 55c and 55d are exposed by second openings 57d between the separating walls 57a'. The separating walls 57a' may be a second molding layer having an etch selectivity with respect to the first molding layer 53. For example, in the event that the first molding layer 53 is a silicon oxide layer, the separating walls 57a' may be a silicon nitride layer. On the contrary, when the first molding layer 53 is a silicon nitride layer, the separating walls 57a' may be a silicon oxide layer.

Lower regions of the second openings 57d are filled with a first semiconductor pattern 61 and a second semiconductor pattern 63 which are sequentially stacked, respectively. The first semiconductor patterns 61 may have the same conductivity type as the word lines 55a, 55b, 55c and 55d, and the second semiconductor patterns 63 may have a different conductivity type from the first semiconductor patterns 61. Namely, the first semiconductor patterns 61 and the second semiconductor patterns 63 may have the second conductivity type and the first conductivity type, respectively. Therefore, the first semiconductor pattern 61 and the second semiconductor pattern 63 thereon constitute a cell diode D. In this case, preferably, the first semiconductor patterns 61 may have an impurity concentration lower than that of the word lines 55a, 55b, 55c and 55d, as described with reference to FIGS. 5A and 5B. In addition, the second semiconductor patterns 63 may have an impurity concentration that is higher than that of the first semiconductor patterns 61.

Alternatively, the first and second semiconductor patterns 61 and 63 may have a different conductivity type form the word lines 55a, 55b, 55c and 55d. Namely, the first and second semiconductor patterns 61 and 63 may have the first conductivity type. In this case, the cell diodes D are composed of the first semiconductor patterns 61 and the word lines 55a, 55b, 55c and 55d, and the first semiconductor patterns 61 may have an impurity concentration lower than those of the second semiconductor patterns 63 and the word lines 55a, 55b, 55c and 55d.

The first semiconductor patterns 61 may be the same material layer as the first semiconductor patterns 9 described with reference to FIGS. 5A and 5B. Similarly, the second semiconductor patterns 63 may be the same material layer as the second semiconductor patterns 11 described with reference to FIGS. 5A and 5B.

Third interfaces F3' between the first semiconductor patterns 61 and the word lines 55a, 55b, 55c and 55d may have substantially the same height as fourth interfaces F4' between the separating walls 57a' and the word lines 55a, 55b, 55c and 55d. In other words, the word lines 55a, 55b, 55c and 55d may have flat surfaces.

Upper regions of the second openings 57d may be filled with a plurality of conductive plugs 65. The conductive plugs 65 may be metal plugs having ohmic contact with respect to the second semiconductor patterns 63. For example, the conductive plugs 65 may be tungsten plugs. The conductive plugs 65 need not be provided. In this case, the second openings 57d may be completely filled with the cell diodes D.

An upper structure having the same configuration as the embodiments described with reference to FIGS. 5A and 5B may be provided on the substrate having the conductive plugs 65, the first molding layer 53 and the separating walls 57a'. Namely, the phase change material patterns 21 and bit lines 29a, 29b, 29c and 29d illustrated in FIGS. 5a and 5b may be disposed on the substrate having the conductive plugs 65. According to these embodiments, the cell diodes D may be self-aligned with the word lines 55a, 55b, 55c and 55d.

Figure 7A:
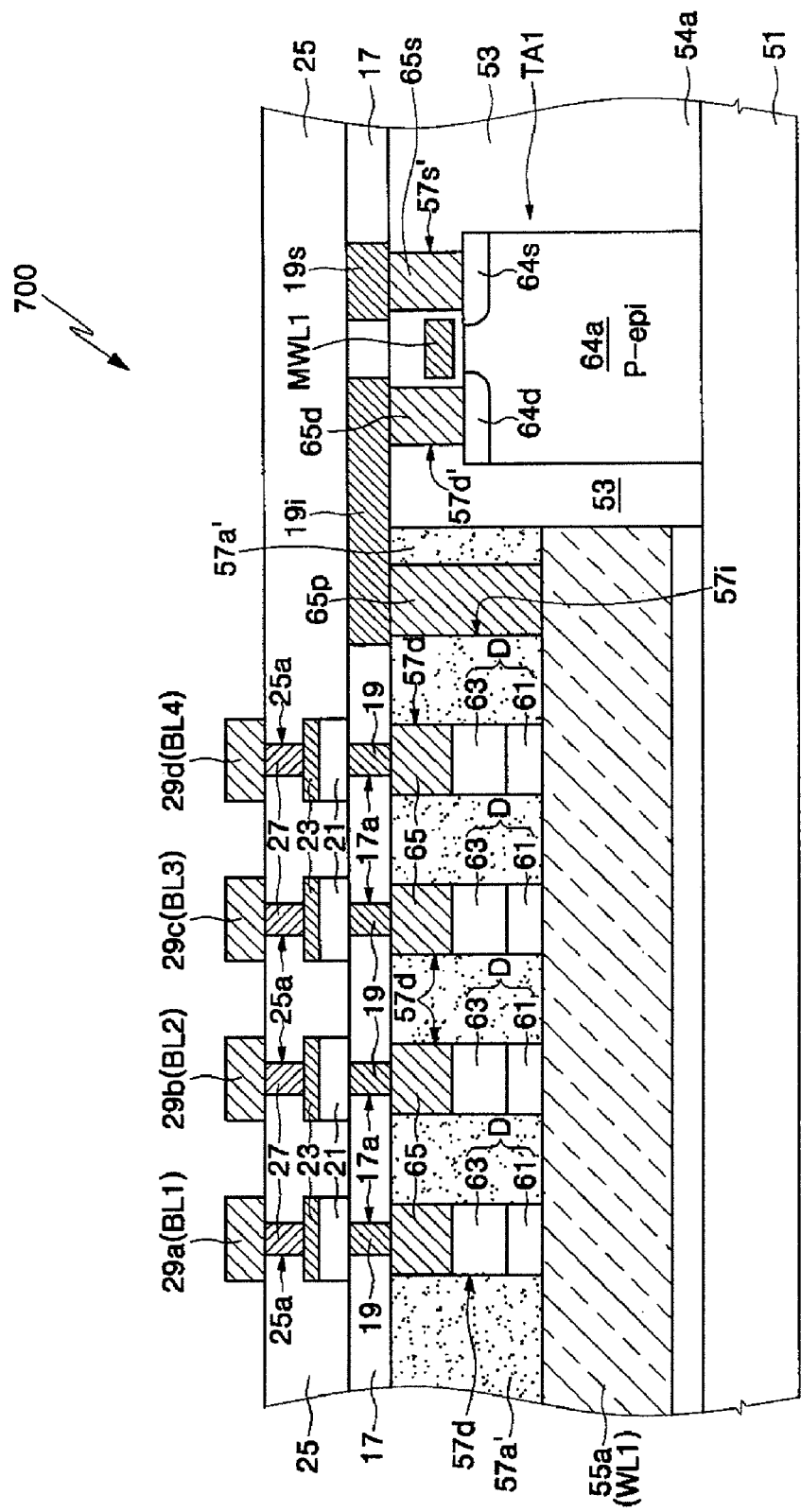
FIG. 7A is a cross sectional view taken along the line I-I' of FIG. 4 to illustrate a cell array region of a phase change memory device according to still another embodiment of the present disclosure.
Figure 7B:
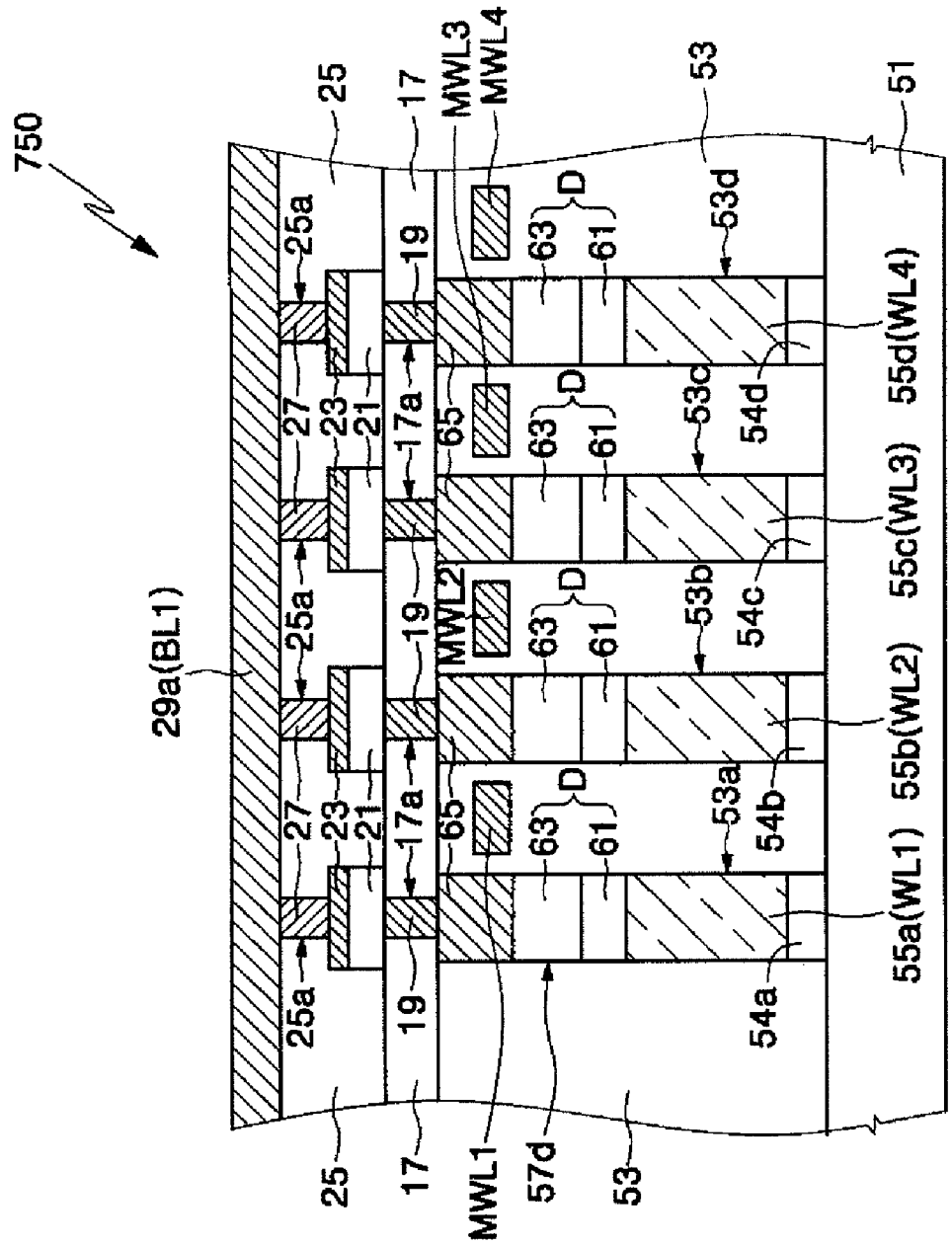
FIG. 7B is a cross sectional view taken along the line II-II' of FIG. 4 to illustrate a cell array region of a phase change memory device according to still another embodiment of the present disclosure.

FIG. 7A is a cross sectional view taken along the line I-I' of FIG. 4 to illustrate a cell block or cell array region 700 of a phase change memory device according to still another embodiment of the present disclosure, and FIG. 7B is a cross sectional view taken along the line II-II' of FIG. 4 to illustrate a cell block or cell array region 750 of a phase change memory device according to still another embodiment of the present disclosure. A plurality of phase change cells in the cell block, according to this embodiment, may have the same structure as the phase change cells described with reference to FIGS. 6A and 6B. However, the phase change cells in the cell block according to this embodiment of the present disclosure are not limited to the phase change cells shown in FIGS. 6A and 6B. For example, the phase change cells in the cell block according to this embodiment may have the same configuration as the phase change cells described with reference to FIGS. 5A and 5B. Therefore, duplicative description for the structure of the phase change cells will be omitted.

Referring to FIGS. 4, 7A and 7B, a plurality of block selection switching elements, such as first to fourth MOS access transistors TA1, TA2, TA3 and TA4, are disposed to be adjacent to end portions of the word lines 55a, 55b, 55c and 55d (or WL1, WL2, WL3 and WL4 in FIG. 4). The first to fourth MOS access transistors TA1, TA2, TA3 and TA4 may be provided at first to fourth epitaxial semiconductor body patterns 64a, 64b, 64c and 64d, respectively, on the semiconductor substrate 51. The epitaxial semiconductor body patterns 64a, 64b, 64c and 64d may be semiconductor patterns, which are grown using the semiconductor substrate 51 as a seed layer. In addition, the epitaxial semiconductor patterns 64a, 64b, 64c and 64d may be P-type semiconductor patterns. Alternatively, the MOS access transistors TA1, TA2, TA3 and TA4 may be directly provided at the semiconductor substrate 51.

The first and third MOS access transistors TA1 and TA3 are each electrically connected to the first and third word lines 55a and 55c, that is, odd word lines, and the second and fourth MOS access transistors TA2 and TA4 are each electrically connected to the second and fourth word lines 55b and 55d, that is, even word lines. In this case, the first and third MOS access transistors TA1 and TA3, that is, a first group of MOS access transistors may be disposed at the right side of the first and third word lines WL1 and WL3, and the second and fourth MOS access transistors TA2 and TA4, that is, a second group of MOS access transistors may be disposed at the left side of the second and fourth word lines WL2 and WL4, as shown in FIG. 4.

Each of the MOS access transistors TA1, TA2, TA3 and TA4 includes a source region 64s and a drain region 64d, which are provided in both ends of the epitaxial semiconductor pattern 64a, 64b, 64c or 64d as well as a gate electrode, which crosses over a channel region between the source region 64a and the drain region 64d. The gate electrodes of the MOS access transistors TA1, TA2, TA3 and TA4 may extend to serve as main word lines MWL1, MWL2, MWL3 and MWL4. Alternatively, the main word lines MWL1, MWL2, MWL3 and MWL4 may be a conductive layer different from the gate electrodes. In this case, the main word lines MWL1, MWL2, MWL3 and MWL4 may be electrically connected to the gate electrodes through local interconnections.

When viewed from a plan view of FIG. 4, the main word lines MWL1, MWL2, MWL3 and MWL4 may be disposed between the word lines WL1, WL2, WL3 and WL4. Levels of the main word lines MWL1, MWL2, MWL3 and MWL4 may be determined according to levels of top surfaces of the epitaxial semiconductor body patterns 64a. For example, when the top surfaces of the epitaxial semiconductor body patterns 64a have the same level as the top surfaces of the cell diodes D, the main word lines MWL1, MWL2, MWL3 and MWL4 may be disposed between the conductive plugs 65, as shown in FIG. 7B. In other words, the first main word line MWL1 may be disposed in the first molding layer 53 between the conductive plugs 65 on the first word line WL1 and the conductive plugs 65 on the second word line WL2, and the second main word line MWL2 may be disposed in the first molding layer 53 between the conductive plugs 65 on the second word line WL2 and the conductive plugs 65 on the third word line WL3. Similarly, the third main word line MWL3 may be disposed in the first molding layer 53 between the conductive plugs 65 on the third word line WL3 and the conductive plugs 65 on the fourth word line WL4, and the fourth main word line MWL4 may be disposed in the first molding layer 53 between the conductive plugs 65 on the fourth word line WL4 and the conductive plugs 65 on a fifth word line adjacent to the fourth word line WL4. When the conductive plugs 65 are not provided, the main word lines MWL1, MWL2, MWL3 and MWL4 may be disposed to pass through regions between the cell diodes D.

The MOS access transistors TA1, TA2, TA3 and TA4 may be covered with the first molding layer 53. In this case, the drain regions 64d are exposed by drain contact holes 57d' passing through the first molding layer 53, and the source regions 64s are exposed by source contact holes 57s' passing through the first molding layer 53. In addition, the ends of the word lines 55a, 55b, 55c and 55d (or WL1, WL2, WL3 and WL4) adjacent to the drain regions 64d may be exposed by interconnection contact holes 57i passing through the separating walls 57a'. The interconnection contact holes 57i, the drain contact holes 57d' and the source contact holes 57s' may be filled with interconnection contact plugs 65p, drain contact plugs 65d and source contact plugs 65s, respectively.

The drain contact plugs 65d are electrically connected to the interconnection contact plugs 65p adjacent to the drain contact plugs 65d through local interconnections 19i provided in the insulating layer 17. In addition, the source contact plugs 65s are electrically connected to ground interconnections 19s provided in the insulating layer 17.

Methods of fabricating phase change memory devices according to embodiments of the present disclosure will be described. FIGS. 8A to 11A are cross-sectional views taken along the line I-I' of FIG. 3 to describe a method of fabricating a cell array region of a phase change memory device according to an embodiment of the present disclosure, and FIGS. 8B to 11B are cross-sectional views taken along the line II-II' of FIG. 3 to describe a method of fabricating a cell array region of a phase change memory device according to an embodiment of the present disclosure. Thus, phase change memory device portions are indicated generally by the reference numerals 800, 850, 900, 950, 1000, 1050, 1100 and 1150 in each of FIGS. 8A, 8B, 9A, 9B, 10A, 10B, 11A and 11B, respectively.

Figure 8A:
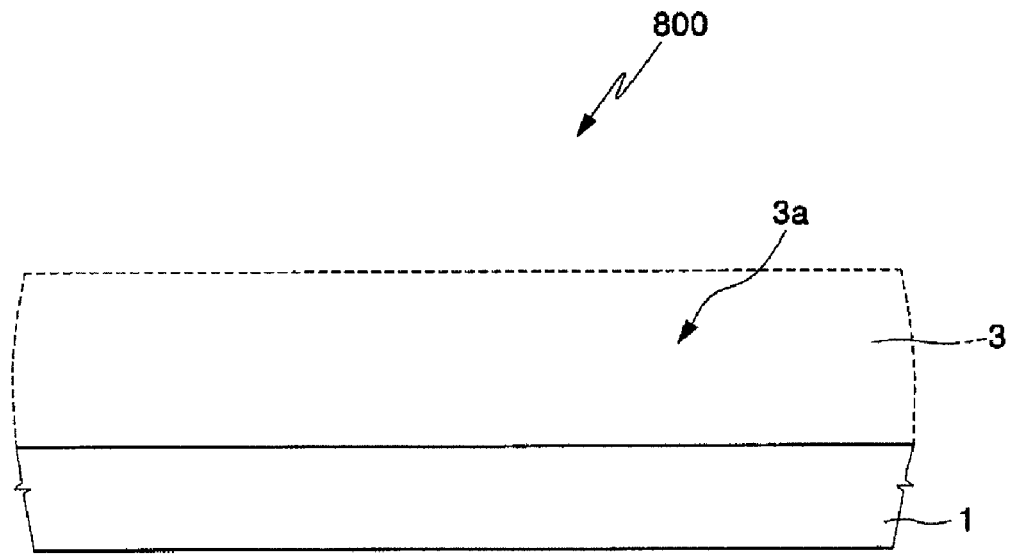
Figure 8B:
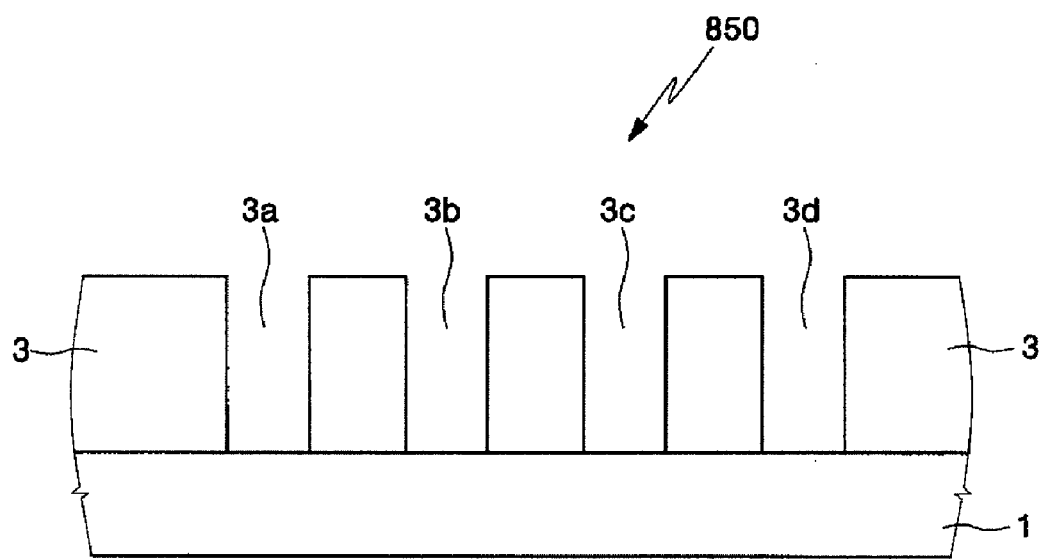

Referring to FIGS. 3, 8A and 8B, a lower molding layer 3 is formed on a semiconductor substrate 1 of a first conductivity type. The semiconductor substrate 1 may be a P-type single crystal semiconductor substrate. The lower molding layer 3 may be formed of an insulating layer such as a silicon oxide layer or a silicon nitride layer. The lower molding layer 3 is patterned to form a plurality of parallel lower openings 3a, 3b, 3c and 3d that expose predetermined regions of the semiconductor substrate 1.

Figure 9A:
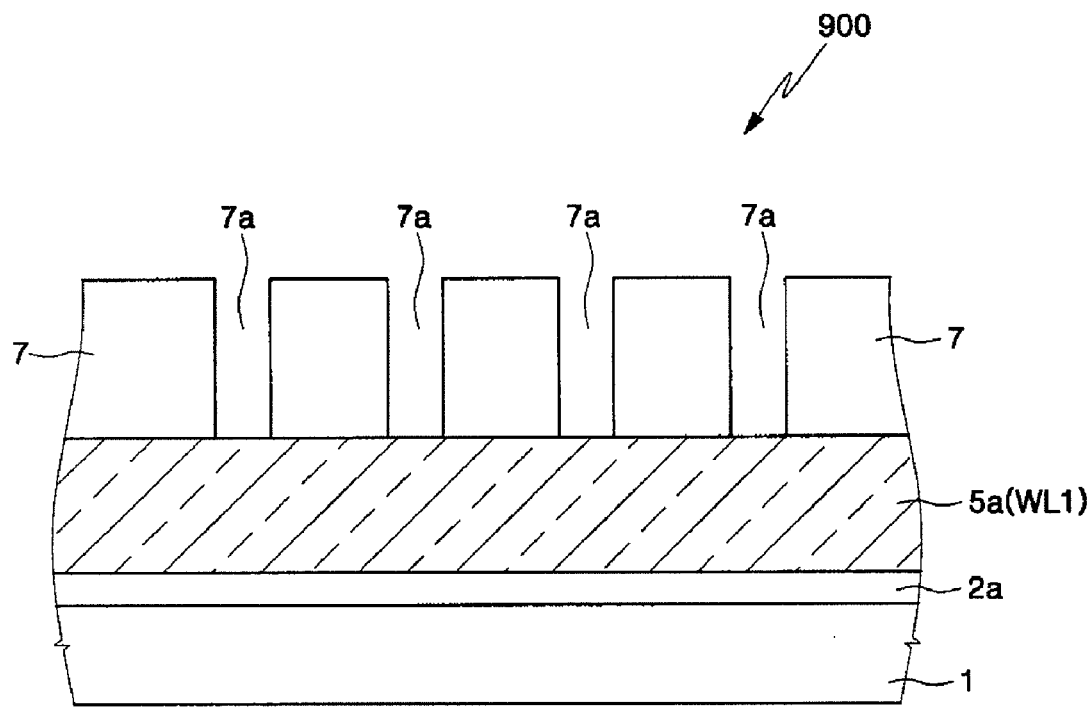
Figure 9B:
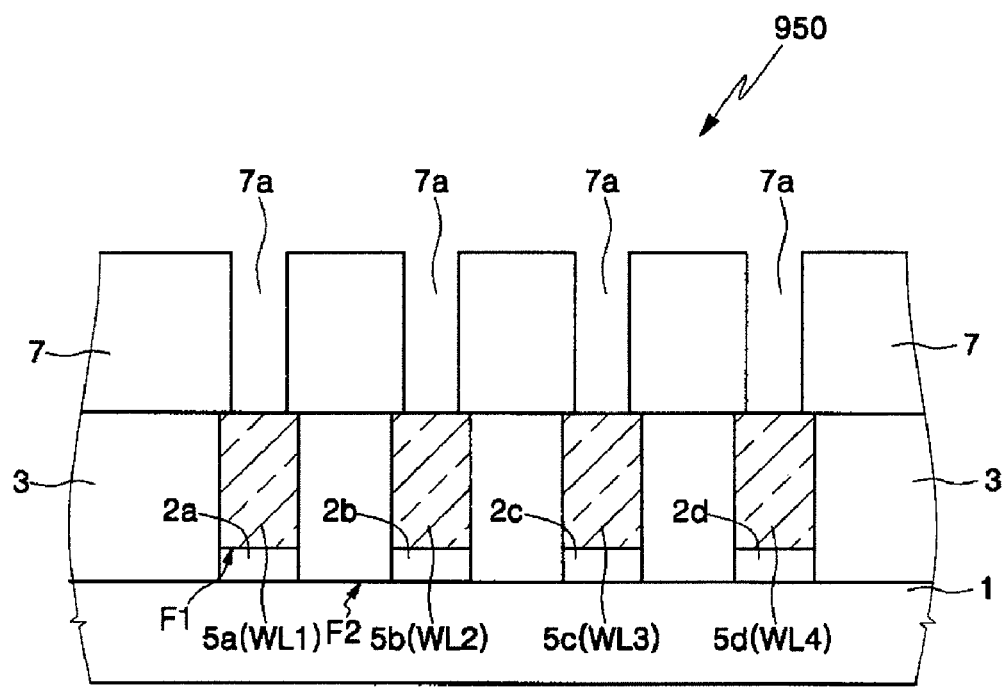

Referring to FIGS. 3, 9A and 9B, buffer lines 2a, 2b, 2c and 2d and word lines 5a, 5b, 5c and 5d (or WL1, WL2, WL3 and WL4 in FIG. 3) filling the lower openings 3a, 3b, 3c and 3d are sequentially formed using a selective epitaxial growth technique that employs the semiconductor substrate 1 exposed by the lower openings 3a, 3b, 3c and 3d as a seed layer. When the semiconductor substrate 1 is a single crystal semiconductor substrate, the buffer lines 2a, 2b, 2c and 2d and the word lines 5a, 5b, 5c and 5d may also be semiconductor patterns having a single crystal structure. The buffer lines 2a, 2b, 2c and 2d are doped with impurities having the first conductivity type, and the word lines 5a, 5b, 5c and 5d are doped with impurities having a second conductivity type different from the first conductivity type. Namely, the buffer lines 2a, 2b, 2c and 2d may be doped with P-type impurities, and the word lines 5a, 5b, 5c and 5d may be doped with N-type impurities. The buffer lines 2a, 2b, 2c and 2d and the word lines 5a, 5b, 5c and 5d may be doped using an in-situ doping technique or an ion implantation technique. Preferably, the word lines 5a, 5b, 5c and 5d are doped to have an impurity concentration that is higher than $1\times10^{19}$ atoms per square centimeter.

Alternatively, the buffer lines 2a, 2b, 2c and 2d and the word lines 5a, 5b, 5c and 5d may be formed using a solid phase epitaxial (SPE) technique. More specifically, a semiconductor layer such as a polycrystalline semiconductor layer or an amorphous semiconductor layer is formed on the substrate having the lower openings 3a, 3b, 3c and 3d, and the semiconductor layer is planarized to expose top surfaces of the lower molding layer 3. As a result, semiconductor patterns are formed in the lower openings 3a, 3b, 3c and 3d. The semiconductor patterns are crystallized using a solid phase epitaxial technique that employs the semiconductor substrate 1 as a seed layer. In the event that the semiconductor substrate 1 has a single crystal structure, the semiconductor patterns may be converted to have a single crystal structure during the solid phase epitaxial process. Impurity ions are implanted into the single crystal semiconductor patterns to form the buffer lines 2a, 2b, 2c and 2d and the word lines 5a, 5b, 5c and 5d. The ion implantation process for forming the buffer lines 2a, 2b, 2c and 2d may be omitted. In this case, the buffer lines 2a, 2b, 2c and 2d are not formed. In addition, the solid phase epitaxial process may be performed prior to planarization of the semiconductor layer. When the polycrystalline semiconductor layer or the amorphous semiconductor layer is formed of an in-situ doped semiconductor layer, the impurity ion implantation process may be omitted.

Electrical resistance of the word lines 5a, 5b, 5c and 5d can be greatly reduced by increasing a thickness of the lower molding layer 3. Nevertheless, according to this embodiment, it is possible to fundamentally prevent any voids or seams from being formed in the lower molding layer 3 between the word lines 5a, 5b, 5c and 5d. This is because the word lines 5a, 5b, 5c and 5d are formed using the selective epitaxial growth technique or the solid phase epitaxial technique, as described above. In addition, according to this embodiment, a length of a current path between the adjacent word lines 5a, 5b, 5c and 5d may increase due to presence of the buffer lines 2a, 2b, 2c and 2d. Accordingly, it is possible to improve electrical isolation characteristics between the word lines 5a, 5b, 5c and 5d. When the buffer lines 2a, 2b, 2c and 2d are formed, bottom surfaces of the word lines 5a, 5b, 5c and 5d (e.g., first interfaces F1 between the word lines 5a, 5b, 5c and 5d and the buffer lines 2a, 2b, 2c and 2d) may be higher than second interfaces F2 between the lower molding layer 3 and the semiconductor substrate 1, as shown in FIG. 9B.

The process for forming the buffer lines 2a, 2b, 2c and 2d may be omitted. In this case, bottom surfaces of the word lines 5a, 5b, 5c and 5d (e.g., the first interfaces F1 between the word lines 5a, 5b, 5c and 5d and the semiconductor substrate 1) may have substantially the same height as the second interfaces F2 between the lower molding layer 3 and the semiconductor substrate 1. This is because it can prevent the semiconductor substrate 1 from being over-etched since an etching process for patterning the word lines 5a, 5b, 5c and 5d is not required. Therefore, there is no limitation in increasing the thickness (e.g., a height) of the word lines 5a, 5b, 5c and 5d.

In other embodiments, the buffer lines 2a, 2b, 2c and 2d and the word lines 5a, 5b, 5c and 5d may be formed using a typical photo/etching process without use of the lower molding layer 3 and the selective epitaxial growth technique. In detail, the buffer lines 2a, 2b, 2c and 2d and the word lines 5a, 5b, 5c and 5d may be formed by sequentially forming a lower epitaxial semiconductor layer having the first conductivity type on the semiconductor substrate 1 and an upper epitaxial semiconductor layer having a second conductivity type different from the first conductivity type and patterning the upper epitaxial semiconductor layer and the lower epitaxial semiconductor layer. An insulating layer is then formed on the substrate having the buffer lines 2a, 2b, 2c and 2d and the word lines 5a, 5b, 5c and 5d, and the insulating layer is planarized to form a word line isolation layer that corresponds to the lower molding layer 3. The process for forming the lower epitaxial semiconductor layer may be omitted. In this case, the buffer lines 2a, 2b, 2c and 2d are not formed.

In still other embodiments, the buffer lines 2a, 2b, 2c and 2d and the word lines 5a, 5b, 5c and 5d may be formed in the semiconductor substrate 1 using a trench isolation technique. For example, a predetermined region of the semiconductor substrate 1 is selectively etched to form a trench region defining a plurality of parallel active regions, and an insulating layer such as a silicon oxide layer is formed on the substrate having the trench region. The insulating layer is planarized to form a trench isolation layer (e.g., a word line isolation layer) that remains in the trench region and corresponds to the lower molding layer 3. Impurity ions are then implanted into the active regions to form the buffer lines 2a, 2b, 2c and 2d and the word lines 5a, 5b, 5c and 5d. The ion implantation process for forming the buffer lines 2a, 2b, 2c and 2d may be omitted.

An upper molding layer 7 is formed on the substrate having the word lines 5a, 5b, 5c and 5d. The upper molding layer 7 may be formed of the same material layer as the lower molding layer 3. Alternatively, the upper molding layer 7 may be formed of a material layer different from the lower molding layer 3. For example, when the lower molding layer 3 is formed of a silicon oxide layer, the upper molding layer 7 may be formed of a silicon nitride layer. Similarly, when the lower molding layer 3 is formed of a silicon nitride layer, the upper molding layer 7 may be formed of a silicon oxide layer.

The upper molding layer 7 is patterned to form a plurality of upper openings 7a that expose predetermined regions of the word lines 5a, 5b, 5c and 5d. The upper molding layer 7 may be patterned so that the upper openings 7a may be two-dimensionally arrayed when viewed from a top plan view. The upper openings 7a may be formed to have a width, which is less than that of the word lines 5a, 5b, 5c and 5d, in consideration of misalignment with the word lines 5a, 5b, 5c and 5d.

Referring to 3, 10A and 10B, cell diodes D filling lower regions of the upper openings 7a are formed using a selective epitaxial growth technique that employs the word lines 5a, 5b, 5c, and 5d exposed by the upper openings 7a as a seed layer. Each of the cell diodes D is formed to have first and second semiconductor patterns 9 and 11, which are sequentially stacked. The first semiconductor patterns 9 are formed using the exposed word lines 5a, 5b, 5c and 5d as seed layers, and the second semiconductor patterns 11 are formed using the first semiconductor patterns 9 as seed layers. Therefore, in the event that the word lines 5a, 5b, 5c and 5d are single crystal semiconductor patterns, the first and second semiconductor patterns 9 and 11 may also be formed to have a single crystal structure.

According to this embodiment, the cell diodes D are formed using the upper molding layer 7 and the selective epitaxial growth technique. In other words, any etching process for forming the separated cell diodes D is not required. As a result, it is possible to prevent the word lines 5a, 5b, 5c and 5d between the cell diodes D from being over-etched during formation of the cell diodes D. Therefore, third interfaces F3 between the first semiconductor patterns 9 and the word lines 5a, 5b, 5c and 5d may have substantially the same height as fourth interfaces F4 between the upper molding layer 7 and the word lines 5a, 5b, 5c and 5d. In other words, even after formation of the first and second semiconductor patterns 9 and 11, top surfaces of the word lines 5a, 5b, 5c and 5d may have substantially flat top surfaces.

The first semiconductor patterns 9 are doped with impurities having the same conductivity type as the word lines 5a, 5b, 5c and 5d, and the second semiconductor patterns 11 are doped with impurities having a different conductivity type from that of the word lines 5a, 5b, 5c and 5d. Further, the first semiconductor patterns 9 may be doped to have an impurity concentration, which is different from that of the second semiconductor patterns 11. For example, the first semiconductor patterns 9 are formed to have an impurity concentration, which is relatively lower than that of the second semiconductor patterns 11. This is for minimizing leakage currents that flows through cell diodes D to which a reverse bias is applied. The reverse bias may be applied to the cell diodes D of non-selected phase change cells in a read mode or a program mode. In addition, the first semiconductor patterns 9 may be formed to have an impurity concentration lower than that of the word lines 5a, 5b, 5c and 5d. The first and second semiconductor patterns 9 and 11 may be doped using an in-situ doping technique or an ion implantation technique.

In other embodiments, the first and second semiconductor patterns 9 and 11 may be doped with impurities having a different conductivity type from the word lines 5a, 5b, 5c and 5d. In this case, the cell diodes D are composed of the first semiconductor patterns 9 and the word lines 5a, 5b, 5c and 5d, and the first semiconductor patterns 9 are preferably formed to have an impurity concentration lower than those of the second semiconductor patterns 11 and the word lines 5a, 5b, 5c and 5d.

In still other embodiments, the cell diodes D may be formed using a solid phase epitaxial technique. In more detail, amorphous semiconductor patterns or polycrystalline semiconductor patterns are formed in the upper openings 7a, 7b, 7c and 7d, and the semiconductor patterns are crystallized using the solid phase epitaxial technique that employs the word lines 5a, 5b, 5c and 5d as seed layers. Next, impurity ions are implanted into the crystallized semiconductor patterns to form the first and second semiconductor patterns 9 and 11.

Subsequently, a conductive layer such as a metal layer is formed on the substrate having the second semiconductor patterns 11, and the conductive layer is planarized to form conductive plugs 13 filling upper regions of the upper openings 7a. The conductive plugs 13 may be formed of a conductive layer having ohmic contact with respect to the second semiconductor patterns 11. For example, the conductive plugs 13 may be formed of a tungsten layer or a titanium nitride layer having ohmic contact with respect to both of a P-type semiconductor and an N-type semiconductor. Prior to formation of the conductive plugs 13, a metal silicide layer 12 such as a cobalt silicide layer may be formed on surfaces of the second semiconductor patterns 11. The process of forming the metal silicide layer 12 and/or the process of forming the conductive plugs 13 may be omitted. When the processes for forming the metal silicide layer 12 and the conductive plugs 13 are omitted, the cell diodes D may be formed to completely fill the upper openings 7a. An insulating layer 17 is formed on the substrate having the conductive plugs 13.

Figure 11A:
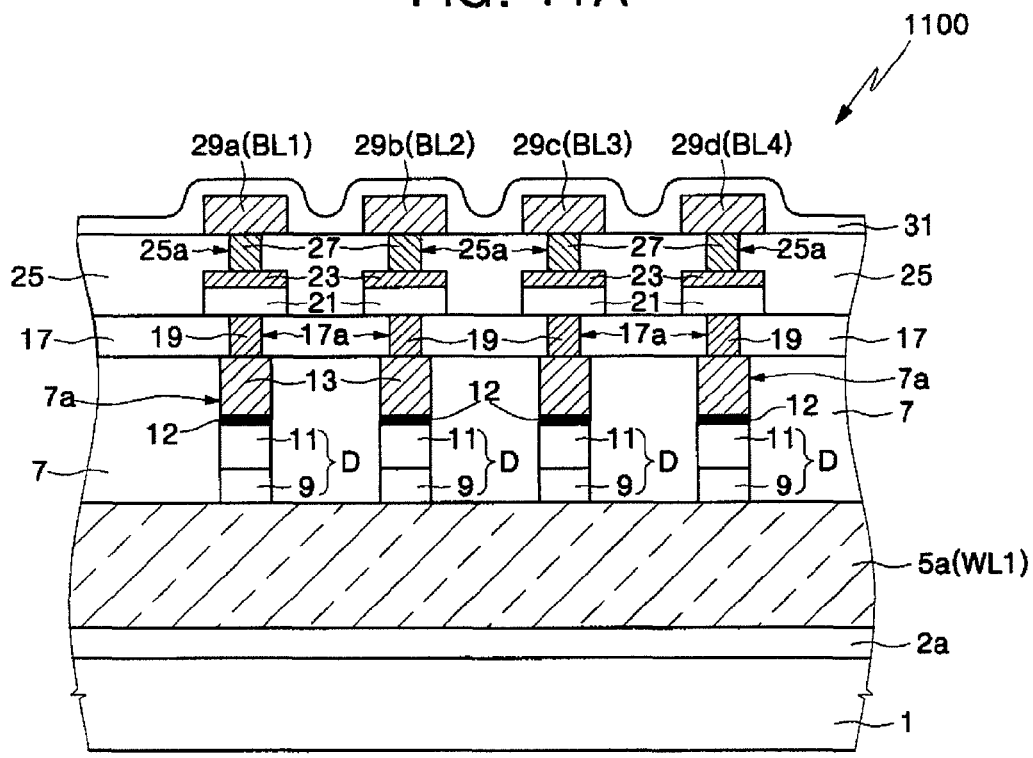
Figure 11B:
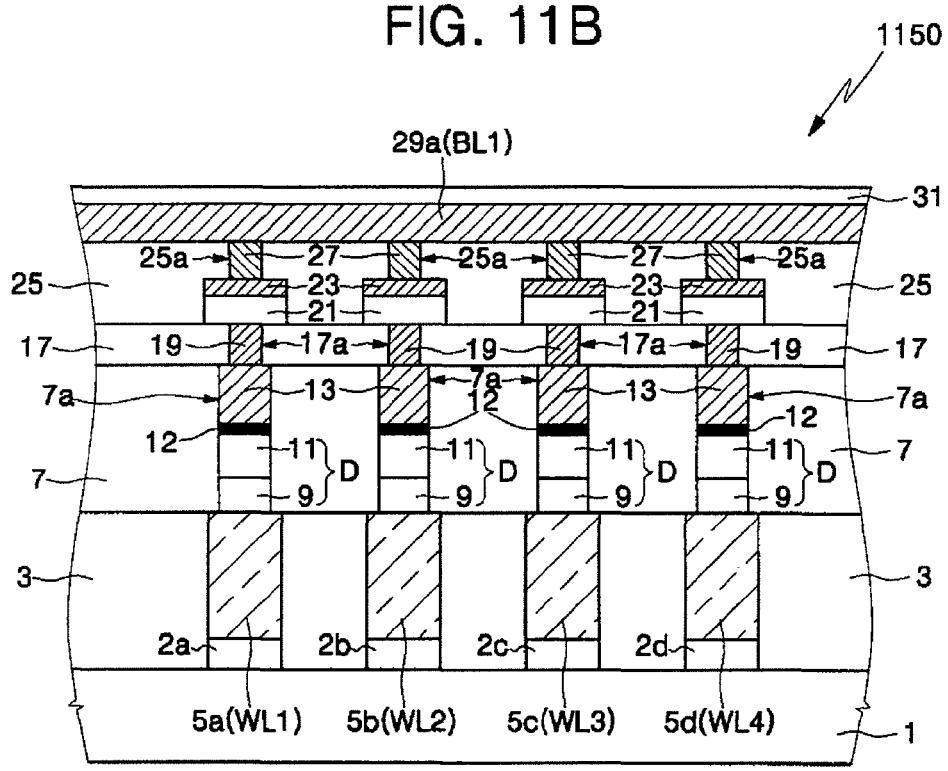

Referring to FIGS. 3, 11A and 11B, the insulating layer 17 is patterned to form a plurality of contact holes 17a that expose the conductive plugs 13. Lower electrodes 19 are formed in the contact holes 17a. The lower electrodes 19 may be formed of a titanium nitride layer. A phase change material layer and an upper electrode layer are sequentially formed on the substrate having the lower electrodes 19. The phase change material layer may be formed of a chalcogenide layer, and the upper electrode layer may be formed of a conductive layer such as a titanium layer. The upper electrode layer and the phase change material layer are patterned to form a plurality of phase change material patterns 21 covering the lower electrodes 19 and upper electrodes 23 stacked on the phase change material patterns 21.

The process for forming the lower electrodes 19 may be omitted. In this case, the phase change material patterns 21 directly contact the conductive plugs 13 through the contact holes 17a. Thus, the phase change material patterns 21 are formed to have a confined configuration, and the conductive plugs 13 serve as lower electrodes.

An interlayer insulating layer 25 is formed on the substrate having the upper electrodes 23. The interlayer insulating layer 25 is patterned to form a plurality of bit line contact holes 25a that expose the upper electrodes 23. Bit line contact plugs 27 are formed in the bit line contact holes 25a, and a conductive layer such as a metal layer is formed on the substrate having the bit line contact plugs 27. The conductive layer is patterned to form a plurality of bit lines 29a covering the bit line contact plugs 27. The bit lines 29a are formed to cross over the word lines 5a, 5b, 5c and 5d (or WL1, WL2, WL3 and WL4 in FIG. 3). A passivation layer 31 is formed on the substrate having the bit lines 29a, 29b, 29c and 29d.

FIGS. 12A to 15A are cross sectional views taken along the line I-I' of FIG. 3 and FIGS. 12B to 15B are cross sectional views taken along the line II-II' of FIG. 3 to describe a method of fabricating a cell array region of a phase change memory device according to another embodiment of the present disclosure. Thus, phase change memory device portions are indicated generally by the reference numerals 1200, 1250, 1300, 1350, 1400, 1450, 1500 and 1550 in each of FIGS. 12A, 12B, 13A, 13B, 14A, 14B, 15A and 15B, respectively. Referring to FIGS. 3, 12A and 12B, a first molding layer 53 is formed on a semiconductor substrate 51 of a first conductivity type. The semiconductor substrate 51 may be a P-type single crystal semiconductor substrate, and the first molding layer 53 may be formed of an insulating layer such as a silicon nitride layer and a silicon oxide layer. The first molding layer 53 is patterned to form a plurality of parallel first openings 53a, 53b, 53c and 53d that expose predetermined regions of the semiconductor substrate 51. A plurality of buffer lines 54a, 54b, 54c and 54d and a plurality of word lines 55a, 55b, 55c and 55d (or WL1, WL2, WL3, and WL4 in FIG. 3) filling lower portions of the first openings 53a, 53b, 53c, and 53d are sequentially formed using a selective epitaxial growth technique that employs the semiconductor substrate 51 exposed by the first openings 53a, 53b, 53c and 53d as seed layers. In addition, when the semiconductor substrate 51 is a single crystal semiconductor substrate, the buffer lines 54a, 54b, 54c and 54d and the word lines 55a, 55b, 55c and 55d may also be semiconductor patterns having a single crystal structure.

The buffer lines 54a, 54b, 54c and 54d are doped with impurities having the first conductivity type, the word lines 55a, 55b, 55c and 55d are doped with impurities having a second conductivity type different from the first conductivity type. Namely, the buffer lines 54a, 54b, 54c and 54d may be doped with P-type impurities, and the word lines 55a, 55b, 55c and 55d may be doped with N-type impurities. The buffer lines 54a, 54b, 54c and 54d and the word lines 55a, 55b, 55c and 55d may be doped using an in-situ doping technique or an ion implantation technique. Further, the word lines 55a, 55b, 55c and 55d may be doped to have an impurity concentration that is higher than $1 \times 10^{19}$ atoms per square centimeter.

In other embodiments, the buffer lines 54a, 54b, 54c and 54d and the word lines 55a, 55b, 55c and 55d may be formed using a solid phase epitaxial technique and an ion implantation technique, as described with reference to FIGS. 9A and 9B.

Electrical resistance of the word lines 55a, 55b, 55c and 55d can be greatly reduced by increasing a thickness of the first molding layer 53. According to this embodiment, it is possible to fundamentally prevent any voids or seams from being formed in the first molding layer 53 between the word lines 55a, 55b, 55c and 55d. This is because the word lines 55a, 55b, 55c and 55d are formed using the selective epitaxial growth technique or the solid phase epitaxial technique as described above. In addition, electrical isolation characteristics between the word lines 55a, 55b, 55c and 55d can be improved due to presence of the buffer lines 54a, 54b, 54c and 54d. When the buffer lines 54a, 54b, 54c and 54d are formed, bottom surfaces of the word lines 55a, 55b, 55c and 55d (e.g., first interfaces F1' between the word lines 55a, 55b, 55c and 55d and the buffer lines 54a, 54b, 54c and 54d) may be higher than second interfaces F2' between the first molding layer 53 and the semiconductor substrate 51, as shown in FIG. 12B.

The process for forming the buffer lines 54a, 54b, 54c and 54d may be omitted. In this case, bottom surfaces of the word lines 55a, 55b, 55c and 55d (e.g., the first interfaces F1' between the word lines 55a, 55b, 55c and 55d and the semiconductor substrate 51) may have substantially the same height as the second interfaces F2' between the first molding layer 53 and the semiconductor substrate 51. This is because any etching process for patterning the buffer lines 54a, 54b, 54c and 54d and the word lines 55a, 55b, 55c and 55d is not required. Therefore, there is no limitation to increasing the thickness (that is, a height) of the word lines 55a, 55b, 55c and 55d.

Figure 13A:
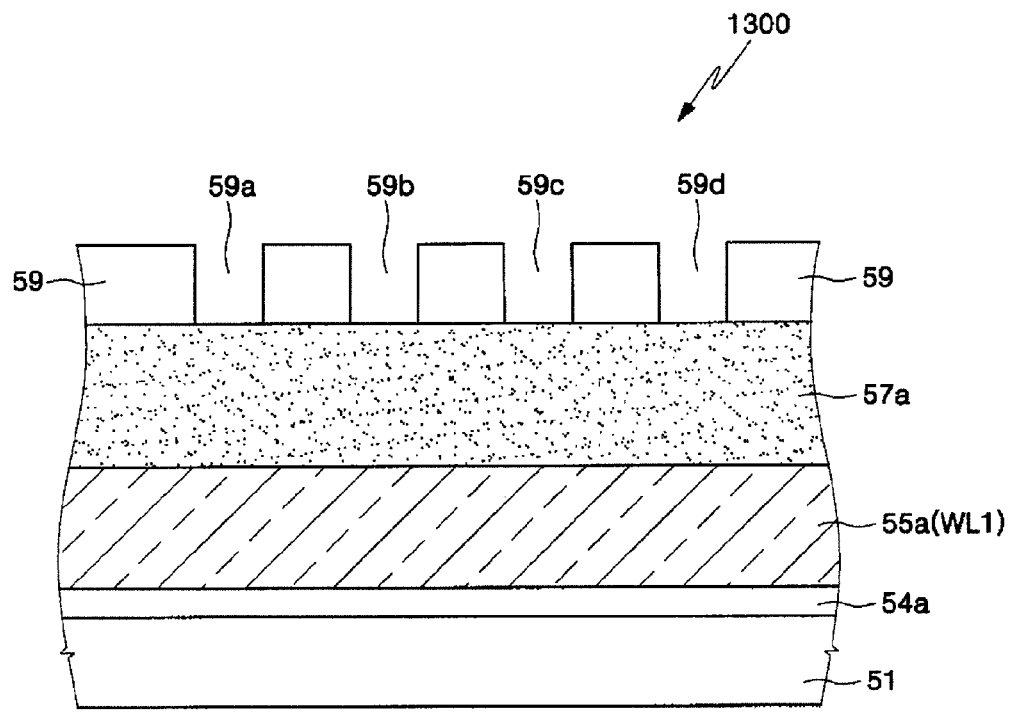
Figure 13B:
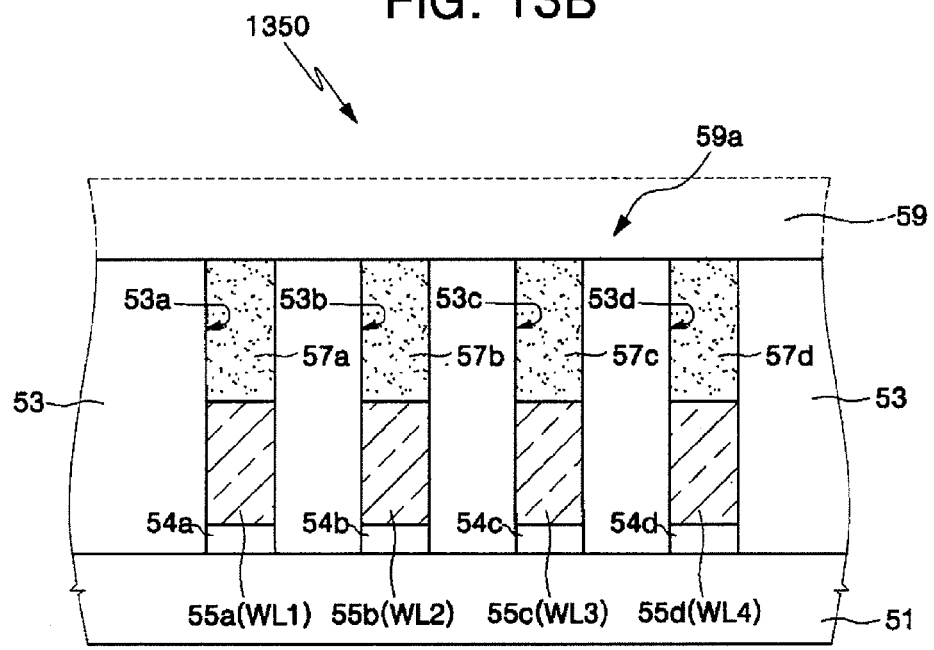

Referring to FIGS. 3, 13A and 13B, a second molding layer filling upper regions of the first openings 53a, 53b, 53c and 53d is formed on the substrate having the word lines 55a, 55b, 55c and 55d. The second molding layer may be formed of an insulating layer having an etch selectivity with respect to the first molding layer 53. For example, when the first molding layer 53 is formed of a silicon oxide layer, the second molding layer may be formed of a silicon nitride layer. Alternatively, when the first molding layer 53 is formed of a silicon nitride layer, the second molding layer may be formed of a silicon oxide layer.

The second molding layer is planarized to expose top surfaces of the first molding layer 53. As a result, second molding layer patterns 57a, 57b, 57c and 57d are formed in upper regions of the first openings 53a, 53b, 53c and 53d. An etching mask 59, for example, or a photoresist pattern is formed on the substrate having the second molding layer patterns 57a, 57b, 57c and 57d. The photoresist pattern 59 is formed to have a plurality of parallel openings 59a, 59b, 59c and 59d, which cross over the word lines 55a, 55b, 55c and 55d.

Figure 14A:
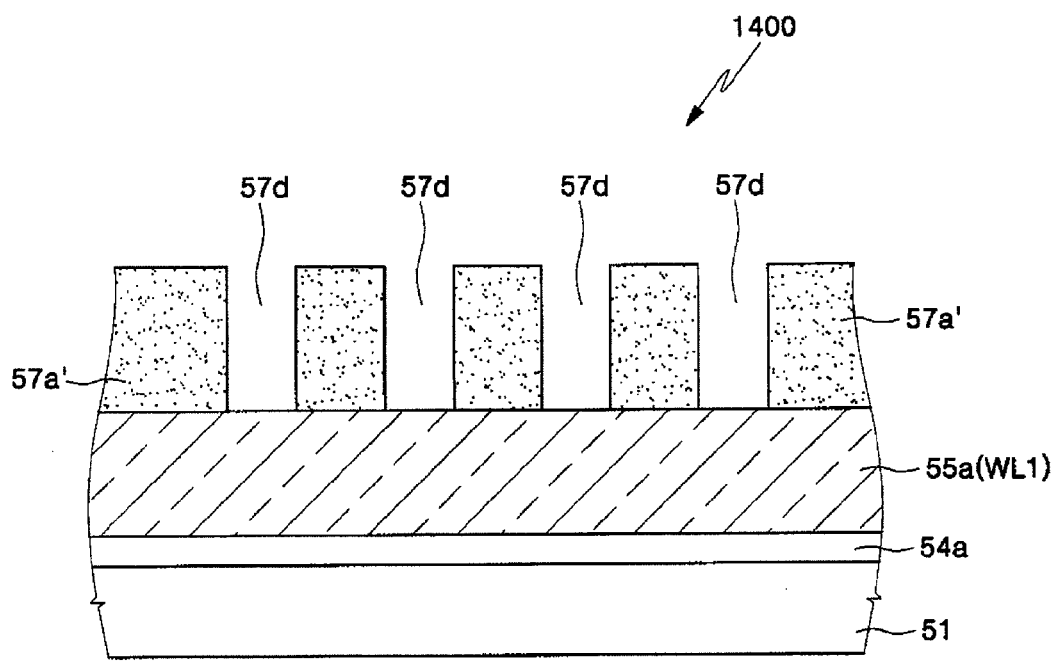
Figure 14B:
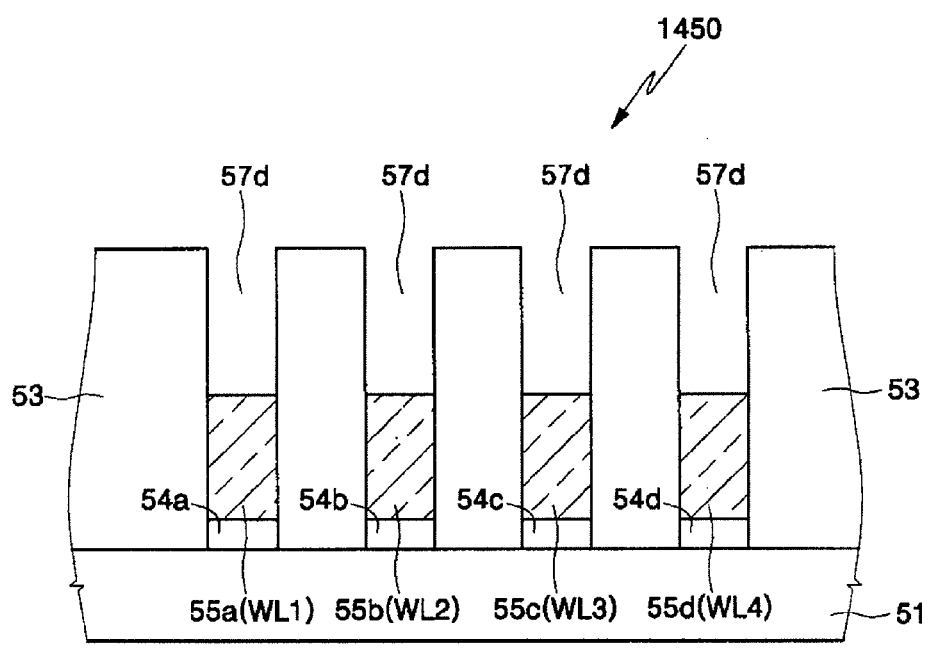

Referring to FIGS. 3, 14A and 14B, the second molding layer patterns 57a, 57b, 57c and 57d are selectively etched using the photoresist pattern 59 as an etching mask, thereby forming a plurality of second openings 57d that expose predetermined regions of the word lines 55a, 55b, 55c and 55d. As a result, separating walls 57a', which are one-dimensionally arrayed, are formed on each of the word lines 55a, 55b, 55c and 55d, as shown in FIG. 14A. According to this embodiment, the second openings 57d may be self-aligned with the word lines 55a, 55b, 55c and 55d. Namely, the second openings 57d are formed to have the same width as the word lines 55a, 55b, 55c and 55d, as shown in FIG. 14B. The photoresist pattern 59 is then removed.

Figure 15A:
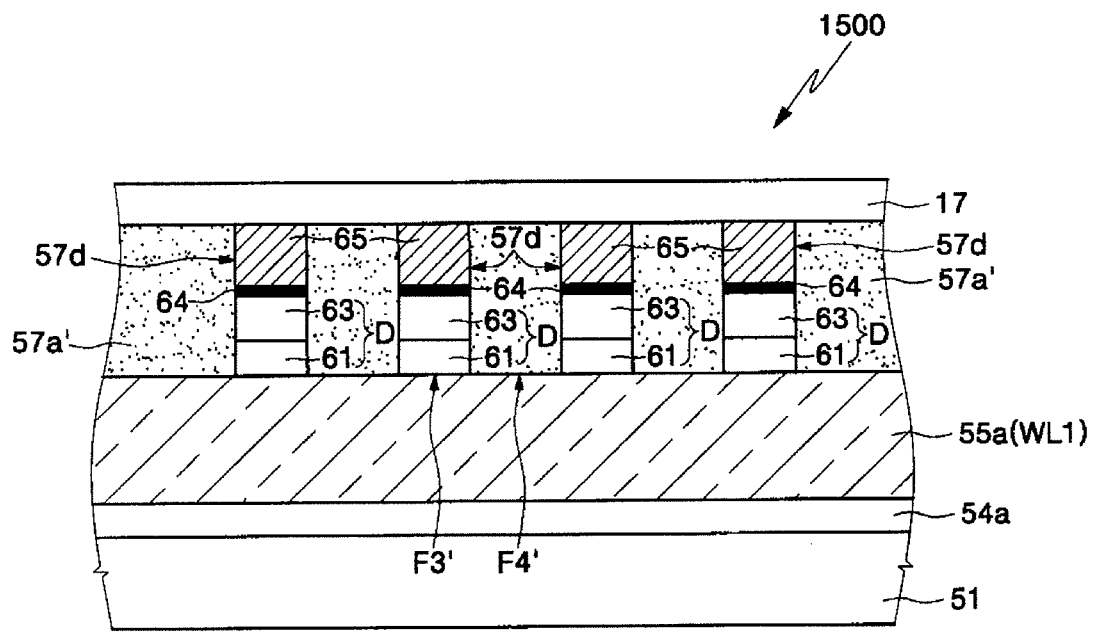
Figure 15B:
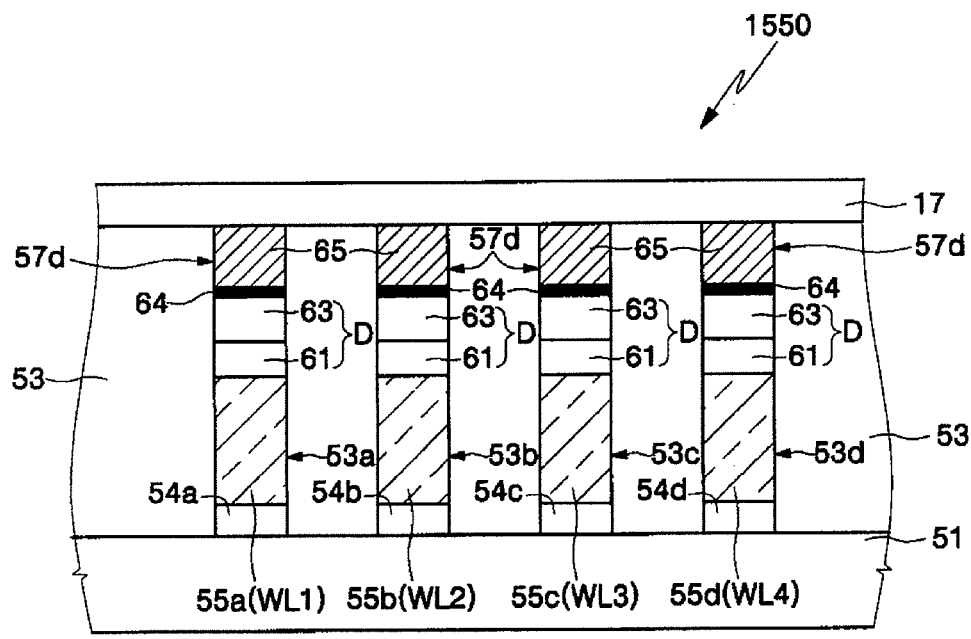

Referring to FIGS. 3, 15A and 15B, a plurality of cell diodes D is formed in lower regions of the second openings 57d. The cell diodes D may be formed using a selective epitaxial growth technique or a solid phase epitaxial technique, as described with reference to FIGS. 10A and 10B. As a result, each of the cell diodes D is formed to have a first semiconductor pattern 61 and a second semiconductor pattern 63 which are sequentially stacked. The first semiconductor patterns 61 are formed to have the same conductivity type as the word lines 55a, 55b, 55c and 55d, and the second semiconductor patterns 63 are formed to have a different conductivity type from the first semiconductor patterns 61. Alternatively, the first and second semiconductor patterns 61 and 63 may be doped with impurities having a different conductivity type from the word lines 55a, 55b, 55c and 55d. In this case, the cell diodes D are composed of the first semiconductor patterns 61 and the word lines 55a, 55b, 55c and 55d, and the first semiconductor patterns 61 may be formed to have an impurity concentration lower than those of the second semiconductor patterns 63 and the word lines 55a, 55b, 55c and 55d.

Figure 10A:
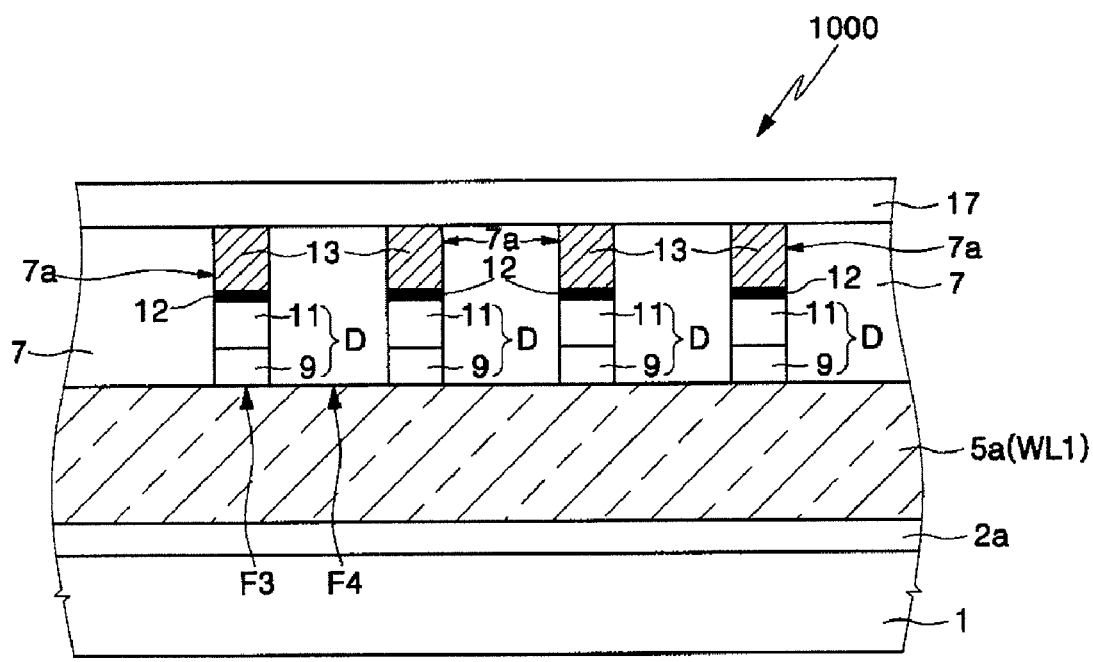
Figure 10B:
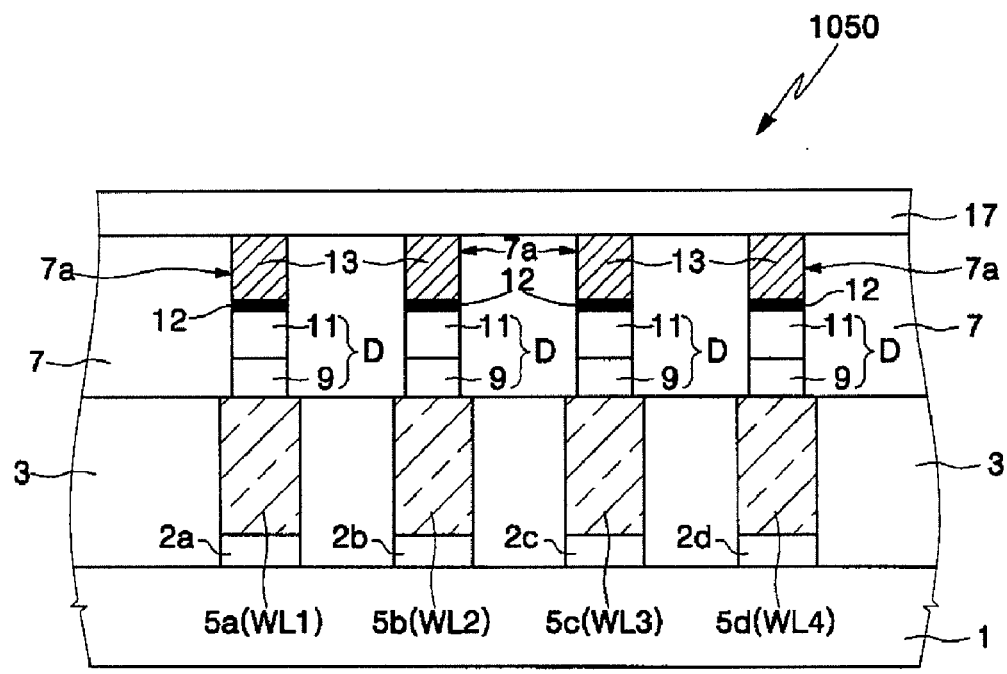

Subsequently, a plurality of metal silicide layers 64 and a plurality of conductive plugs 65 may be formed in upper regions of the second openings 57d using the same methods as the embodiments described with reference to FIGS. 10A and 10B. The process for forming the metal silicide layers 64 and/or the process for forming the conductive plugs 65 may be omitted. When the processes for forming the metal silicide layers 64 and the conductive plugs 65 are omitted, the cell diodes D may be formed to completely fill the second openings 57d. A plurality of phase change material patterns and a plurality of bit lines are also formed on the substrate having the conductive plugs 65 using the same methods as described with reference to FIGS. 11A and 11B.

According to the present disclosure, word lines and cell diodes are formed on a semiconductor substrate using a molding layer and a selective epitaxial growth technique. Therefore, even though a thickness (that is, a height) of the word lines increase in order to reduce electrical resistance of the word lines, the technique can prevent any voids or seams from being formed in the molding layer between the word lines. In addition, any patterning processes accompanying an etching process are not required to form the word lines and the cell diodes. Therefore, the technique can prevent the semiconductor substrate and the word lines from being recessed. As a result, since the electrical resistance of the word lines can be minimized without process defects in a limited area, operations of parasitic bipolar transistors in a phase change cell array region can be remarkably suppressed.

Although illustrative embodiments have been described herein with reference to the accompanying drawings, it is to be understood that the present invention is not limited to those precise embodiments, and that various changes and modifications may be effected therein by one of ordinary skill in the pertinent art without departing from the scope or spirit of the present invention. All such changes and modifications are intended to be included within the scope of the present invention as set forth in the appended claims.

What is claimed is:

1. A semiconductor device, comprising:
   a semiconductor substrate including a first portion of a first conductivity type;
   a word line at the first portion of the semiconductor substrate, the word line having a second conductivity type, the second conductivity type being different from the first conductivity type;
   a molding layer on the word line, the molding layer having an opening that exposes a predetermined portion of the word line;
   a first semiconductor pattern in the opening of the molding layer, the first semiconductor pattern having the first conductivity type;
   an insulating layer on the molding layer;
   a lower electrode at an opening of the insulating layer electrically connected with the first semiconductor pattern;
   a phase change material pattern on the lower electrode; and
   an upper electrode on the phase change material pattern,
   wherein the word line comprises a first portion extending under and between each of a plurality of phase change memory cell of the semiconductor device, the plurality of phase change memory cells including a first phase change memory cell comprising the lower electrode, the phase change material pattern and the upper electrode, and wherein a cross sectional profile, taken along a length direction of the first portion of the word line, of the first portion of the word line has an entire top surface that is flat.

2. The semiconductor device according to claim 1, wherein the first conductivity type is a P-type, and the second conductivity type is an N-type.

3. The semiconductor device according to claim 1, further comprising a second semiconductor pattern in the opening of the molding layer in direct contact with the first portion of the semiconductor substrate exposed with respect to the opening of the molding layer,
wherein the first semiconductor pattern is in direct contact with the second semiconductor pattern, and
wherein the first semiconductor pattern is crystalline and the second semiconductor pattern is crystalline.

4. The semiconductor device according to claim 3, wherein the second semiconductor pattern has an impurity concentration lower than that of the first semiconductor pattern and the word line.

5. The semiconductor device according to claim 3, wherein the word line, the first semiconductor pattern and the second semiconductor pattern comprise single crystal semiconductors.

6. The semiconductor device according to claim 1, further comprising:
an interlayer insulating layer on the upper electrode, the interlayer insulating layer having a bit line contact hole that exposes the upper electrode;
a bit line contact plug in the bit line contact hole in direct contact with the upper electrode; and
a bit line covering the bit line contact plug.

7. The semiconductor device according to claim 1, further comprising:
a metal silicide on the first semiconductor pattern and located in the opening of the molding layer;
a conductive plug on the metal silicide and located in the opening of the molding layer from a location above the metal silicide to a height of at least a top surface of the molding layer adjacent the opening, the conductive plug being of a different material than the metal silicide,
wherein a cross sectional profile of the opening of the molding layer comprises a first sidewall of the opening with a continuous profile and a second sidewall of the opening with a continuous profile, each of the first and second sidewalls extending from a top of the opening of the molding layer to a bottom of the opening of the molding layer.

8. The semiconductor device according to claim 7, wherein the metal silicide is in direct contact with the first semiconductor pattern and the conductive plug is in direct contact with the metal silicide.

9. The semiconductor device according to claim 8, wherein the lower electrode is in direct contact with the conductive plug.

10. The semiconductor device according to claim 7, wherein the metal silicide comprises a cobalt silicide.

11. The semiconductor device according to claim 7, wherein the conductive plug comprises a material selected from a group consisting of tungsten layer and titanium nitride layer.

12. The semiconductor device according to claim 1, wherein the phase change material pattern is in the opening of the insulating layer.

13. The semiconductor device according to claim 12, wherein the phase change material pattern is in the opening of the insulating layer having a confined configuration.

14. The semiconductor device according to claim 13, further comprising:
a conductive plug in the opening of the molding layer,
wherein the phase change material pattern is electrically connected to the diode through the conductive plug, and
wherein a cross sectional profile of the opening of the molding layer comprises a first sidewall of the opening with a continuous profile and a second sidewall of the opening with a continuous profile, each of the first and second sidewalls extending from a top of the opening of the molding layer to a bottom of the opening of the molding layer.

15. The semiconductor device according to claim 14, further comprising:
a silicide in the opening of the molding layer and in direct contact with the first semiconductor pattern.

16. The semiconductor device according to claim 1, wherein the lower electrode comprises a titanium nitride layer.

17. The semiconductor device according to claim 1, wherein the word line is on the first portion of the substrate.

18. The semiconductor device according to claim 17, wherein the word line is a crystalline material located in an opening of an insulating layer and in direct contact with the first portion of the semiconductor substrate.

19. The semiconductor device according to claim 1, wherein the word line comprises an integral part of the semiconductor substrate.

20. The semiconductor device according to claim 19, wherein the word line comprises a doped portion of the semiconductor substrate.

21. The semiconductor device according to claim 20, further comprising a trench in the semiconductor substrate at least partially defining the word line, and an insulating material in the trench region.

22. The semiconductor device according to claim 21, further comprising a second semiconductor pattern confined in the opening of the molding layer and in direct contact with the semiconductor substrate exposed with respect to the opening of the molding layer, and
wherein the first semiconductor pattern is a semiconductor pattern in direct contact with the second semiconductor pattern, and
wherein the first semiconductor pattern is crystalline and the second semiconductor pattern is crystalline.

23. The semiconductor device of claim 19, wherein the word line consists of an integral part of the semiconductor substrate.

24. The semiconductor device of claim 1,
wherein the word line is in a first material having a planar top surface,
wherein the entire top surface of the first portion of the word line is co-planar with the entire planar top surface of the first material.

25. The semiconductor device of claim 24, wherein the first material is an insulating layer sandwiched between the molding layer and the semiconductor substrate.

26. The semiconductor device of claim 24, wherein the first material is the semiconductor substrate.

27. A semiconductor device, comprising:
a semiconductor substrate;
a word line;
a molding layer on the semiconductor substrate, the molding layer having an opening;
a diode comprising a first crystalline portion, the first crystalline portion in the opening of the molding layer and electrically connected with the word line;

a metal silicide on the diode and located in the opening of the molding layer;

a conductive plug on the metal silicide and located in the opening of the molding layer from a location above the metal silicide to a height of at least a top surface of the molding layer adjacent the opening, the conductive plug being of a different material than the metal silicide;

an insulating layer on the molding layer and the conductive plug, the insulating layer having an opening that exposes a portion of the conductive plug;

a lower electrode in the opening of the insulating layer;

phase change material on the lower electrode; and an upper electrode on the phase change material, wherein a cross sectional profile of the opening of the molding layer comprises a first sidewall of the opening with a continuous profile and a second sidewall of the opening with a continuous profile, each of the first and second sidewalls extending from a top of the opening of the molding layer to a bottom of the opening of the molding layer.

28. The semiconductor device according to claim 27, wherein the diode comprises a second crystalline portion in the opening of the molding layer, wherein the first crystalline portion has a first conductivity type opposite a second conductivity type of the second crystalline portion.

29. The semiconductor device according to claim 28, wherein a portion of the semiconductor substrate under the molding layer has the first conductivity type.

30. The semiconductor device according to claim 28, wherein the first conductivity type is a P-type, and the second conductivity type is an N-type.

31. The semiconductor device according to claim 28, wherein the second crystalline portion is in direct contact with the semiconductor substrate exposed with respect to the opening of the molding layer, and the first crystalline portion is in direct contact with the second crystalline portion.

32. The semiconductor device according to claim 31, wherein the word line comprises an integral part of the semiconductor substrate.

33. The semiconductor device of claim 32, wherein the word line consists of an integral part of the semiconductor substrate.

34. The semiconductor device according to claim 31, wherein the second crystalline portion has an impurity concentration lower than that of the first crystalline portion and the word line.

35. The semiconductor device according to claim 27, wherein the first crystalline portion has a first conductivity type opposite a second conductivity type of the word line, and the first crystalline portion is in direct contact with the word line, and wherein the diode comprises at least portions of the first crystalline portion and the word line.

36. The semiconductor device according to claim 27, wherein the word line comprises an integral part of the semiconductor substrate.

37. The semiconductor device of according to claim 36, wherein a top surface of the word line is coplanar with a top surface of the semiconductor substrate.

38. The semiconductor device of claim 36, wherein the word line consists of an integral part of the semiconductor substrate.

39. The semiconductor device of claim 27, wherein the semiconductor device comprises a phase change memory device and the phase change material pattern forms at least part of a memory cell of the phase change memory device.

40. The semiconductor device according to claim 27, further comprising:

an interlayer insulating layer on the upper electrode, the interlayer insulating layer having a bit line contact hole that exposes the upper electrode;

a bit line contact plug in the bit line contact hole in direct contact with the upper electrode; and a bit line connecting with the bit line contact plug.

41. The semiconductor device according to claim 27, wherein the word line and the first crystalline portion of the diode comprise single crystal semiconductors.

42. The semiconductor device according to claim 27, wherein the metal silicide comprises a cobalt silicide.

43. The semiconductor device according to claim 27, wherein the conductive plug comprises a material selected from a group consisting of tungsten and titanium nitride.

44. The semiconductor device according to claim 27, wherein the lower electrode comprises a titanium nitride layer.

45. The semiconductor device of claim 27, wherein the width of the word line is larger than the width of the diode, the width of the word line and the width of the diode being measured with respect to a cross section taken in a direction perpendicular to a length direction of the word line.

46. The semiconductor device of claim 27, wherein a top surface of the conductive plug is coplanar with a top surface of the molding layer adjacent the conductive plug.

47. A semiconductor device, comprising:

a semiconductor substrate;

a molding layer on the semiconductor substrate, the molding layer having an opening;

a word line;

a diode comprising a crystalline material of a first conductivity type in the opening of the molding layer and electrically connected with the word line;

an insulating layer on the molding layer, the insulating layer having an opening;

a lower electrode at the opening of the insulating layer and electrically connected with the diode;

a phase change material pattern on the lower electrode; and an upper electrode on the phase change material pattern, wherein the width of the word line is different from the width of the diode, the width of the word line and the width of the diode being measured with respect to a cross section taken in a direction perpendicular to a length direction of the word line.

48. The semiconductor device according to claim 47, wherein the word line is in the semiconductor substrate.

49. The semiconductor device of according to claim 48, wherein a top surface of the word line is coplanar with a top surface of the semiconductor substrate.

50. The semiconductor device according to claim 49, wherein the diode further comprises a crystalline material of a second conductivity type in the opening of the molding layer, wherein the second conductivity type is opposite the first conductivity type.

51. The semiconductor device according to claim 49, wherein the word line has a second conductivity type which is opposite the first conductivity type.

52. The semiconductor device according to claim 51, wherein the diode further comprises a portion of the word line.

53. The semiconductor device according to claim 47,
wherein the molding layer is a first molding layer, and
the device further comprises a second molding layer between the first molding layer and the semiconductor substrate,
wherein the word line is comprises a crystalline material in an opening in the second molding layer.

54. The semiconductor device according to claim 53, wherein a top surface of the word line is coplanar with a top surface of the second molding layer.

55. The semiconductor device according to claim 47,
wherein the diode further comprises a crystalline material of a second conductivity type in the opening of the molding layer, wherein the second conductivity type is opposite the first conductivity type.

56. The semiconductor device according to claim 55, wherein an entire top surface of a portion of the word line extending under and between plural phase change memory cells of the semiconductor device is flat, the plural phase change memory cells including a first phase change memory cell comprising the lower electrode, the phase change material pattern and the upper electrode.

57. The semiconductor device according to claim 55, wherein the first conductivity type is a P-type, and the second conductivity type is an N-type.

58. The semiconductor device according to claim 55, wherein the crystalline material of the second conductivity type in the opening of the molding layer is in direct contact with the semiconductor substrate exposed by the opening of the molding layer, and the crystalline material of the first conductivity type in the opening of the molding layer is in direct contact with the crystalline material of the second conductivity type in the opening of the molding layer.

59. The semiconductor device according to claim 55, wherein the word line, the first semiconductor pattern and the second semiconductor pattern comprise single crystal semiconductors.

60. The semiconductor device according to claim 55, further comprising:
a metal silicide in the opening of the molding layer on the crystalline material of the second conductivity type in the opening of the molding layer.

61. The semiconductor device according to claim 60, further comprising:
a conductive plug in the opening of the molding layer on the crystalline material of the first conductivity type in the opening of the molding layer from a location above the metal silicide to a height of at least a top surface of the molding layer adjacent the opening, the conductive plug being of a different material than the metal silicide,
wherein a cross sectional profile of the opening of the molding layer comprises a first sidewall of the opening with a continuous profile and a second sidewall of the opening with a continuous profile, each of the first and second sidewalls extending from a top of the opening of the molding layer to a bottom of the opening of the molding layer.

62. The semiconductor device according to claim 60, wherein the metal silicide comprises a cobalt silicide.

63. The semiconductor device according to claim 61, wherein the conductive plug comprises a material selected from a group consisting of tungsten and titanium nitride.

64. The semiconductor device according to claim 61, wherein the lower electrode is the conductive plug.

65. The semiconductor device according to claim 64, wherein the phase change material directly contacts the conductive plug.

66. The semiconductor device according to claim 47, wherein the lower electrode is in the opening of the insulating layer.

67. The semiconductor device according to claim 47, wherein the phase change material is in the opening of the insulating layer.

68. The semiconductor device according to claim 67, wherein the phase change material is in the opening of the insulating layer having a confined configuration.

69. The semiconductor device according to claim 68, further comprising:
a conductive plug in the opening of the molding layer,
wherein phase change material is electrically connected to the diode through the conductive plug, and
wherein a cross sectional profile of the opening of the molding layer comprises a first sidewall of the opening with a continuous profile and a second sidewall of the opening with a continuous profile, each of the first and second sidewalls extending from a top of the opening of the molding layer to a bottom of the opening of the molding layer.

70. The semiconductor device according to claim 69, further comprising:
a silicide in the opening of the molding layer and in direct contact with the crystalline material of the first conductivity type in the opening of the molding layer.

71. The semiconductor device according to claim 47, further comprising:
crystalline material of the second conductivity type in the opening of the molding layer;
wherein the word line comprises an integral part of the semiconductor substrate, and
the crystalline material of the first conductivity type in the opening of the molding layer has an impurity concentration lower than that of the crystalline material of the second conductivity type in the opening of the molding layer and the word line.

72. The semiconductor device of claim 71, wherein the word line consists of an integral part of the semiconductor substrate.

73. The semiconductor device of claim 47, wherein the semiconductor device comprises a phase change memory device and the phase change material pattern forms at least part of a memory cell of the phase change memory device.

74. The semiconductor device according to claim 47, further comprising:
an interlayer insulating layer on the upper electrode, the interlayer insulating layer having a bit line opening that exposes the upper electrode;
a bit line contact plug in the bit line opening in direct contact with the upper electrode; and
a bit line covering the bit line contact plug.

75. The semiconductor device according to claim 47,
wherein the lower electrode comprises a titanium nitride layer.

76. The semiconductor device of claim 47, wherein the width of the word line is larger than the width of the diode.

77. A semiconductor device, comprising:
a semiconductor substrate including a first portion of a first conductivity type;
a word line at the first portion of the semiconductor substrate, the word line having a second conductivity type, the second conductivity type being different from the first conductivity type;
a molding layer on the word line, the molding layer having an opening that exposes a predetermined portion of the word line;

a diode, at least part of which is in the opening, in electrical communication with the word line;
an insulating layer on the molding layer;
a lower electrode in an opening of the insulating layer and electrically connected with the diode;
a phase change material pattern on the lower electrode; and
an upper electrode on the phase change material pattern,
wherein the word line comprises a first portion extending under and between each of a plurality of phase change memory cells of the semiconductor device, the plurality of phase change memory cells including a first phase change memory cell comprising the lower electrode, the phase change material pattern and the upper electrode, and
wherein a cross sectional profile, taken along a length direction of the first portion of the word line, of the first portion of the word line has an entire top surface that is flat.

78. The semiconductor device of claim 77,
wherein the word line is in a first material having a planar top surface,
wherein the entire top surface of the first portion of the word line is co-planar with the entire planar top surface of the first material.

79. The semiconductor device of claim 78, wherein the first material is an insulating layer sandwiched between the molding layer and the semiconductor substrate.

80. The semiconductor device of claim 78, wherein the first material is the semiconductor substrate.

81. The semiconductor device of claim 77,
wherein the width of the word line is larger than the width of the diode, the width of the word line and the width of the diode being measured with respect to a cross section taken in a direction perpendicular to the length direction of the word line.

* * * * *